United States Patent [19]
Araki et al.

[11] Patent Number: 6,052,331
[45] Date of Patent: Apr. 18, 2000

[54] SYNCHRONOUS SEMICONDUCTOR DEVICE ALLOWING REDUCTION IN CHIP AREA BY SHARING DELAY CIRCUIT

[75] Inventors: Takashi Araki; Kenichi Yasuda, both of Hyogo, Japan

[73] Assignee: Mitsubishi Denki Kabushiki Kaisha, Tokyo, Japan

[21] Appl. No.: 09/225,450

[22] Filed: Jan. 6, 1999

[30] Foreign Application Priority Data

Jul. 15, 1998 [JP] Japan .................................. 10-200655

[51] Int. Cl.[7] ......................................................... G11C 8/00
[52] U.S. Cl. ..................................... 365/233; 365/230.03
[58] Field of Search ............................. 365/233, 230.03, 365/189.05, 194, 230.08

[56] References Cited

U.S. PATENT DOCUMENTS

| 5,483,497 | 1/1996 | Mochizuki et al. | 365/233 |
| 5,592,433 | 1/1997 | Tomita et al. | 365/230.06 |
| 5,592,434 | 1/1997 | Iwamoto et al. | 365/233 |
| 5,764,590 | 6/1998 | Iwamoto et al. | 365/233 |
| 5,844,859 | 12/1998 | Iwamoto et al. | 365/233 |
| 5,867,446 | 2/1999 | Konishi et al. | 365/233 |

*Primary Examiner*—Trong Phan
*Attorney, Agent, or Firm*—McDermott, Will & Emery

[57] ABSTRACT

A control signal generating circuit in a synchronous semiconductor memory device outputs timing signals for controlling activation of a word line and activation of sense amplifier, by delaying an external control signal by prescribed time periods. A bank control signal generating circuit provided for each bank holds activation of the timing signal from the control signal generating circuit, and outputs a signal for controlling timing of activation of the word line and timing of activation of the sense amplifier of the corresponding bank.

16 Claims, 18 Drawing Sheets

SYNCHRONOUS SEMICONDUCTOR DEVICE ALLOWING REDUCTION IN CHIP AREA BY SHARING DELAY CIRCUIT

BACKGROUND OF THE INVENTION

1. Field of the Invention

The present invention relates to a synchronous semiconductor memory device for exchanging signals with the outside in synchronization with a clock signal applied periodically from the outside.

2. Description of the Background Art

In memory application systems, speed of operation of a dynamic random access memory (hereinafter referred to as DRAM) used as a main memory has been increased. The speed of operation, however, has not yet sufficiently follow the speed of operation of a microprocessor (hereinafter referred to as an MPU). This is said to be a cause of lower performance of the overall system, with access time and cycle time of the DRAM being a bottleneck. Recently, various high speed DRAMs operating in synchronization with an external clock signal have been proposed as main memory for a high speed MPU.

Configuration and operation of a synchronous dynamic random access memory (hereinafter referred to as an SDRAM) as a representative among these will be briefly described in the following. The SDRAM is capable of high speed access to a prescribed number of continuous bits in synchronization with a system clock signal.

FIG. 14 is a timing chart representing a standard operation of the SDRAM.

FIG. 14 shows operation timings when continuous 8 bits of data are written and read to and from the SDRAM.

Referring to FIG. 14, at a rising edge of an external clock signal ext.CLK, which is a system clock, at time t1, the SDRAM takes a row address signal Xa in response to external control signals, that is, a chip select signal /CS and a row address strobe signal /RAS both at an active state (logical low, "L" level).

Thereafter, at time t2, in response to the chip select signal /CS and the column address strobe signal /CAS being at the active state ("L" level), reading operation is designated, and a column address signal Yb is taken.

More specifically, an address signal Add. is time-divisionally multiplexed as row address signal Xa and column address signal Yb, and applied to the SDRAM.

In accordance with the row address signal Xa and the column address signal Yb taken in this manner, row and column selecting operations take place in the SDRAM.

After a cycle corresponding to CAS latency (in the example of FIG. 14, three clock cycles), at time t3, first data is output. Thereafter, in response to the rise of the clock signal CLK, data is output from the SDRAM in each cycle from time t4 to t10. The number of bits read continuously here is referred to as burst length, and in FIG. 14, the burst length is 8.

At time t8, in response to the chip select signal ICS, the row address strobe signal /RAS and a write enable signal /WE all at the active state ("L" level), precharge operation is designated.

Thereafter, in a writing operation, at time t10, in response to the chip select signal /CS and the row address strobe signal /RAS both at the active state, a row address signal Xc is taken.

Thereafter, at time t11, when chip select signal /CS, column address strobe signal /CAS and write enable signal /WE are all at the active state of "L" level, a write operation is designated, a column address signal Yd is taken, and data d0 applied at that time is taken as first write data to the SDRAM.

In this manner, row and column selecting operations are performed in response to the fall of signals /RAS and /CAS in the SDRAM.

In cycles from t12 to 18, 8 bits of input data d1, ..., d7 are taken successively in synchronization with an internal clock signal CLK, and the input data are successively written to the memory cells.

In a conventional common DRAM, operations of taking address signals and input data are synchronized with external control signals, that is, row address strobe signal /RAS and column address strobe signal /CAS. By contrast, in the SDRAM, external signals such as the address strobe signals /RAS, /CAS, address signals and input data are taken at a rising edge of an externally applied external clock signal ext.CLK which is, for example, a system clock.

Further, in the SDRAM, memory cells contained therein are operated divided into a plurality of banks, as will be described later. The configuration in which the internal memory cell array is divided into a plurality of banks makes it possible for the banks to perform activating operation (for example, raising of potential level of a word line, activation of a sense amplifier), inactivating operation (lowering of the word line level, inactivation of the sense amplifier) and a precharge operation, almost independent from each other.

In the following, an SDRAM of 2 bank configuration will be described as an example.

In a common DRAM, a precharge operation is indispensable before every access. This is a cause that makes the cycle time in a read or write operation of the common DRAM almost twice the access time.

In the SDRAM with the inside divided into a plurality of banks, however, if a bank 1 is being accessed while a bank 2 is precharged, it is possible to access bank 2 without any precharge time.

In this manner, it becomes possible to eliminate loss time derived from precharging, by alternately accessing/precharging banks 1 and 2. In other words, this is the interleave operation conventionally utilized externally on a plurality of DRAM devices incorporated into the internal operation of the SDRAM chip.

FIG. 15 is a schematic diagram showing a configuration of a conventional word driver, FIG. 16 is a schematic diagram showing a configuration of a conventional RX decoder, and FIG. 17 is a schematic diagram showing a configuration corresponding to a column of memory cells.

Referring first to FIG. 15, predecoded address signals Xj, Xk and Xl are input to a decoder 800. Predecode signal Xj is input to the gate of P channel MOS transistor P11 and the gate of N channel MOS transistor N11. N channel MOS transistor N12 receives predecode signal Xk at its gate. Further, predecode signal X1 is supplied to the gate of N channel MOS transistor N13.

At a standby state, predecode signals Xj, Xk and Xl are all at the "L" level. Accordingly, a P channel MOS transistor P11 is rendered conductive, and a node n11 is precharged to a power supply potential Vdd.

In response, a signal output from an inverter 802 is at the "L" level, and therefore in a word driver 820 corresponding to a word line WL0, with an N channel MOS transistor QD1 receiving at its gate the power supply potential Vdd and receiving at one of its source/drain the output from inverter 802 interposed, a node n21, that is, the gate of a transistor QW1 attains to the "L" level.

N channel MOS transistor QW1 has its drain connected to RX0 among common word lines RX0 to RX3, and an N channel MOS transistor QL1 is provided between the source of transistor QW1 and a ground potential. At a connection node between transistors QW1 and QL1, word line WL0 is connected. Transistor QL1 receives at its gate potential level of node n11.

Word drivers 830 to 850 provided corresponding to other word lines WL1 to WL3, respectively, basically have the same configuration as word driver 820 except that the word drivers are connected to different common word lines.

An exemplary circuit of a typical RX driver 700 is shown in FIG. 16. A capacitance Cb for boosting is provided, with one end of the capacitance Cb driven by a signal RXP obtained by delaying an RX trigger signal RXT itself by a delay circuit 704. Because of capacitive coupling, potential level at the other end of capacitance Cb is boosted to be Vcc+Vthm (Vthm:threshold voltage of memory cell transistor NA) or higher. The potential level of the aforementioned the other end of the capacitance Cb is transmitted to a node RX through a transistor 706 operating as a diode. A decode circuit 750 decodes an address signal (for example, lower bits A0 and A1), and selects any of transistors 710, 720, 730 and 740, and in response, any of transistors 712, 722, 732 and 742 is rendered conductive. The potential level of node RX is transmitted as signals RX0 to RX3 through the selected one of the transistors 712, 722, 732 and 742.

Referring to FIG. 17, the memory cell capacitor Cp receives a cell plate potential Vcp generated in the SDRAM at one end, and connected at the other end to a bit line BL through an access transistor NA. The transistor NA has its gate connected to a corresponding word line WL.

A sense amplifier 860 is provided for a pair of bit lines BL and /BL complementary to each other. Sense amplifier 860 includes an N channel sense amplifier 910 which is activated when the ground potential GND is supplied through a transistor QN receiving at its gate a signal S0N, and a P channel sense amplifier 920 which is activated when the power supply potential Vdd is supplied through a transistor Qp receiving at its gate a sense amplifier activating signal /S0P. Further, corresponding to the pair of bit lines BL and /BL, a precharge circuit 930 activated by a signal BLEQ for holding potentials of the pair of bit lines at the same potential level Vdd/2 and a column selection gate 940 activated by a column selection line CSL for connecting corresponding I/O line pair I/O, /I/O to the bit line pair BL, /BL are provided.

Operations of the word driver and the sense amplifier of the conventional SDRAM shown in FIGS. 15, 16 and 17 will be described with reference to FIG. 18.

Generally, a bank in the SDRAM is activated by an ACT command applied externally. More specifically, at a rising edge of external clock signal ext.CLK at time t0, for example, if chip select signal /CS and row address strobe signal /RAS are both at the "L" level and column address strobe signal /CAS and write enable signal /WE are both at the "H" level, the SDRAM recognizes that the ACT command is applied.

In this case, at time t1, internal row address strobe signal int.RAS in the SDRAM attains to the "H" level, and the address signal at that time point is taken in the SDRAM as a row address signal X.

The row address signal is latched in the SDRAM, and established as internal row address signals RAD and /RAD (in the following, the internal row address will be generally referred to as signals RAD and /RAD).

When internal row address signals RAD and /RAD are established, the address signal is predecoded by the predecoder, and predecode signals Xj, Xk and Xl are generated.

When any of the word drivers is selected in accordance with the predecode signals Xj, Xk and Xl input to decoder 800, potential level of a node n21 in the word driver attains to Vdd−Vth1 (where Vth1 represents threshold voltage of transistor DQ1).

Thereafter, based on the internal row address strobe signal int.RAS, a potential boosted to be not lower than (Vdd+Vthm) (where Vthm represents threshold voltage of memory cell transistor NA) by the RX trigger signal RXT obtained by delaying the internal row address strobe signal until the time point t2, is applied to any of the common word lines RX.

When common word line RX0 is set to the selected state among common word lines RX0 to RX3, by a coupling between node n21 and the common word line resulting from gate capacitance of transistor QW1, potential level of node n21 attains to Vdd+Vthm+Vth2 (where potential Vth2 represents threshold voltage of transistor QW1) or higher, and the potential of the selected common word line RX0 is transmitted with the level maintained as it is, to the selected word line WL0, for example.

Accordingly, when stored data is read from a memory cell MC to a bit line BL, there is not a potential drop corresponding to the threshold voltage of access transistor NA, and therefore S/N in data reading from the memory cell is improved.

When the potential level of the word line rises, potential level of bit line BL which has been precharged to Vdd/2 in advance changes in accordance with the data stored in the memory cell MC.

Thereafter, by a sense amplifier activating signal S0N obtained by delaying the signal RXT to time t3 and a sense amplifier activating signal /S0P obtained by delaying the signal RXT to time t4, transistors QN and QP in sense amplifier 900 are rendered conductive successively, and by sense amplifier 900, data appearing on the bit lines is amplified.

FIG. 18 shows an example in which "H" level data is stored in the memory cell MC.

When an external Write command or a Read command is input, a column address signal Y is taken at that time point.

By a signal obtained by internally decoding column address signal Y, column selection signal CSL corresponding to the selected column of memory cells is activated, and bit line BL is connected to data input/output line pair I/O, whereby data is written or read.

The inactivating operation of the SDRAM takes place when a PCG command (precharge command) is input externally. More specifically, at a rising edge of external clock signal ext.CLK, if chip select signal CS, row address strobe signal /RAS and write enable signal /WL are all at the "L" level and column address strobe signal /CAS is at the "H" level, then at time t5, internal row address strobe signal int.RAS is set to the inactive state ("L" level). By delaying the internal row address strobe signal int.RAS to the time point t6, the signal RXT attains to the "L" level at time t6.

In response, the level of word line WL0 falls, and the data which has been on the bit line BL is again stored in the memory cell.

By the signals S0N and /S0P obtained by delaying the signal RXT to time point t7, transistors QN and QP of sense amplifier 900 are turned off. Thereafter, precharge circuit 930 is rendered conductive, and bit line BL is again precharged to Vdd/2.

In this manner, the series of operations of activating and inactivating banks are performed by successively delaying internally generated signals, in accordance with externally input commands.

FIG. 19 is a schematic block diagram showing configuration of a control signal generating circuit controlling the conventional bank operation.

When there are banks 0 to N in the SDRAM, control circuits 950 to 970 are provided corresponding to the banks 0 to N, respectively.

Here, control signal generating circuit 950 corresponding to bank0, for example, includes: a delay circuit 952 receiving an internal row address strobe signal int.RAS0 corresponding to bank0, delaying the signal for a period corresponding to t1 to t2 or the period from t5 to t6 in FIG. 18 to output a signal RXT0; a delay circuit 954 receiving the signal RXT0, delaying the signal for a period from t2 to t3 or from t6 to t7 to output a sense amplifier activating signal S0N0; a delay circuit 956 receiving an output from delay circuit 954, delaying the output for a period from t3 to t4 and outputting the delayed signal; and an NAND circuit 958 receiving the signal S0N0 and the output from delay circuit 956 to provide sense amplifier activating signal /S0P0.

Control signal generating circuits 960 to 970 provided corresponding to other banks 1 to N basically have the same configuration as control signal generating circuit 950.

The conventional control signal generating circuit for the SDRAM has the above described configuration, in which a relatively large amount of delay is required of each delay circuit.

When word line WL0 rises, for example, in addition to the capacitances of a large number of memory cells connected to word line WL0, there is extremely high capacitance•resistance values because of long interconnections in the memory cell array. Therefore, an extremely high time constant is necessary for driving the word line WL0. Accordingly, it takes considerably long time for the word line WL0 to attain the potential level of the corresponding common word line RX0.

Therefore, from the rise of the signal RXT at time t2 until the potential level of word WL0 attains to the potential level of the common word line RXT and the data stored in the memory cell appears as sufficient difference in potential levels on bit line BL, the start of operation of the sense amplifier must be delayed.

Actually, in order to ensure operation margin, it is necessary to defer start of operation of the sense amplifier until time t3.

Similarly, when the word line WL0 falls, from the time t6 when the signal RXT attains to the "L" level, until the potential level of word line WL0 attains to the ground potential (0V) and data re-holding operation to the memory cell is completed, termination of operation of the sense amplifier must be delayed. Actually, in order to ensure operation margin, it is necessary to defer termination of the operation of the sense amplifier until time t7.

From the reasons described above, a delay circuit having relatively large amount of delay is necessary for generating signals for controlling activation and inactivation of the banks. This means that a large area is necessary as an area for forming the delay circuit. Especially in a plural bank configuration such as provided in the SDRAM, a delay circuit is necessary for each bank, which leads to increased chip area.

SUMMARY OF THE INVENTION

An object of the present invention is to provide a synchronous semiconductor memory device such as an SDRAM having plural bank configuration, which suppresses increase in chip area by suppressing an area for a delay circuit necessary for generating a signal controlling activation and inactivation of each bank.

Briefly stated, the present invention provides a synchronous semiconductor memory device operating in synchronization with an external clock signal, including a memory cell array, a plurality of memory cell selecting circuits, a plurality of read circuits and a control circuit.

The memory cell array includes a plurality of memory cells arranged in a matrix of rows and columns. The memory cell array is divided into a plurality of memory cell blocks.

The plurality of memory cell selecting circuits are provided corresponding to the plurality of memory blocks respectively, and select, independent from each other, a memory cell in the corresponding memory block, in accordance with an address signal.

The plurality of read circuits are provided corresponding to the plurality of memory blocks respectively, and read data stored in the selected memory cell.

The control circuit controls the operation of the synchronous semiconductor memory device in accordance with external control signals.

The control circuit includes: a timing control circuit provided common to the plurality of memory blocks, for delaying an external control signal to generate a timing control signal for controlling operation timing of a selected memory cell block; and a plurality of block control circuits provided corresponding to the plurality of memory blocks respectively, for controlling the operation of the corresponding memory block in response to the timing control signal.

According to another aspect, the present invention provides a synchronous semiconductor memory device operating in synchronization with an external clock signal, including a memory cell array, a plurality of memory cell selecting circuits, a plurality of read circuits and a control circuit.

The memory cell array includes a plurality of memory cells arranged in a matrix of rows and columns. The memory cell array is divided into a first plurality of memory cell blocks.

The plurality of memory cell selecting circuits are provided corresponding to the first plurality of memory blocks respectively, and select independent from each other a memory cell in the corresponding memory block in accordance with an address signal.

The plurality of read circuits are provided corresponding to the first plurality of memory blocks respectively, for reading data stored in the selected memory cell.

The control circuit controls the operation of the synchronous semiconductor memory device in accordance with external control signals.

The control circuit includes a timing control circuit and a plurality of block control circuits.

The timing control circuit is provided common to the first plurality of memory blocks, and generates, in response to an external control signal, a timing control signal for controlling an operation timing of the selected memory cell block.

The timing control circuit includes a second plurality of delay circuits smaller than the first plurality, for generating the timing control signal by delaying an applied external signal by a prescribed time period, and a switch circuit for successively allocating the external control signal to respective ones of the second plurality of delay circuits.

The plurality of block control circuits are provided corresponding to the plurality of memory blocks respectively, and control the operation of the corresponding memory block in response to the timing control signal.

Therefore, an advantage of the present invention is that, in a plural bank configuration, a circuit for generating control signals corresponding to respective banks formed by a delay circuit occupying a large area is shared by a plurality of banks, and therefore increase in the chip area is suppressed.

Another advantage of the present invention is that operation margin is ensured even when external commands are applied continuously.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
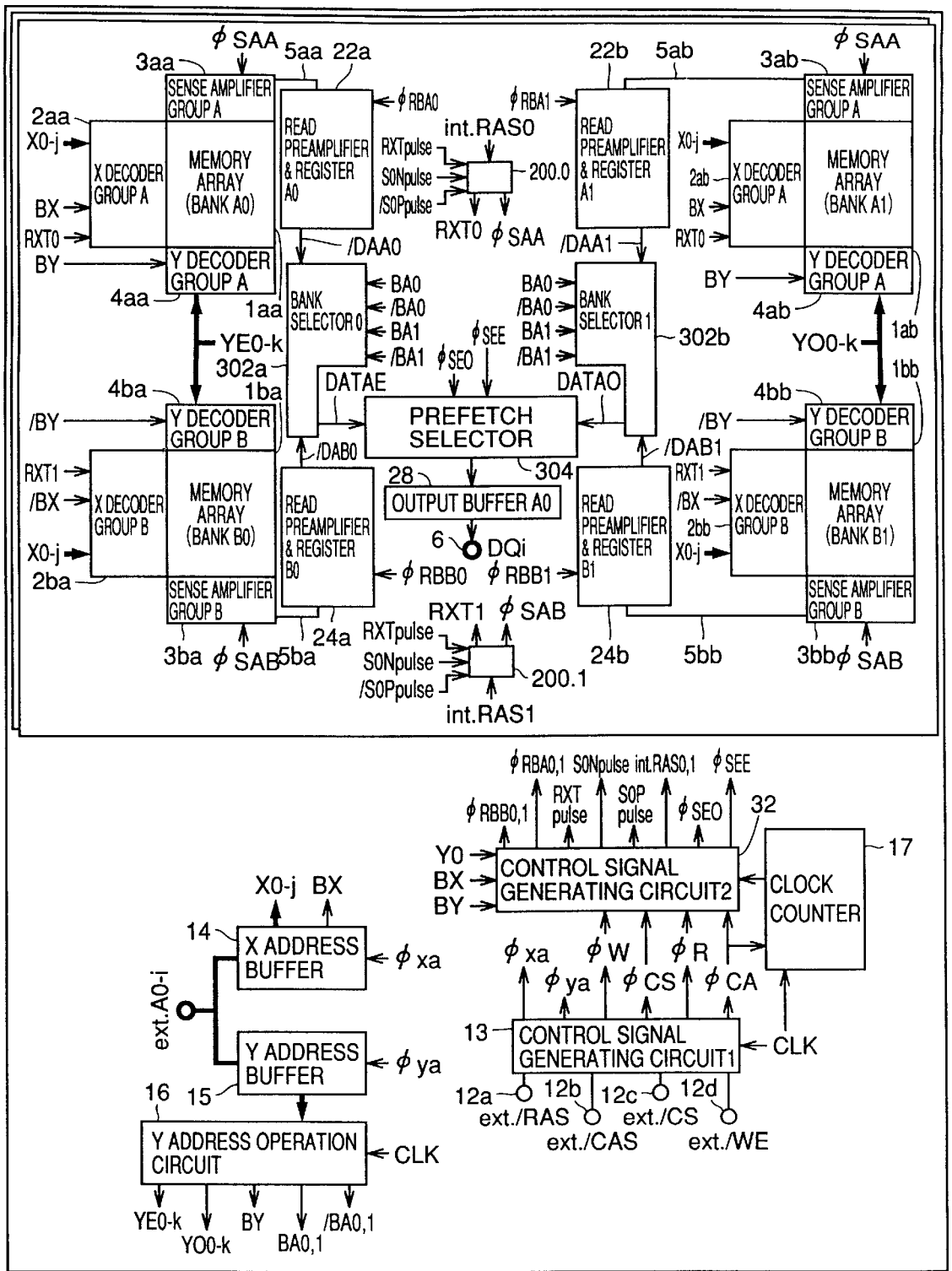
FIG. 1 is a schematic block diagram representing configuration of an SDRAM 1000 in accordance with a first embodiment of the present invention.

FIG. 1 schematically shows configuration of a synchronous semiconductor memory device 1000 in accordance with the first embodiment of the present invention. In the following, though not limiting, the configuration of a 2 bit prefetch type SDRAM will be described briefly, as an example of the synchronous semiconductor memory device.

As will be apparent from the following description, the present invention is not limited to this configuration and applicable to other configurations.

FIG. 1 represents configuration of a portion related to reading of 1 bit of data and peripheral circuitry related to reading. The portion related to data reading is provided corresponding to each data input/output terminal.

Referring to FIG. 1, SDRAM 1000 includes memory arrays 1aa, 1ab, 1ba and 1bb each having a plurality of memory cells arranged in a matrix of rows and columns.

SDRAM 1000 has two banks, where memory arrays 1aa and 1ab constitute bank A and memory arrays 1ba and 1bb constitute bank B.

In banks A and B, memory array 1aa constitutes a sub bank A0, memory array 1ab a sub bank A1, memory array 1ba a sub bank B0 and memory array 1bb constitutes sub bank B1.

In the 2 bit prefetch configuration, the SDRAM functions as a 2-bank SDRAM. Banks A and B can be driven to the active/inactive state independent from each other. Bank is designated by a bank address applied simultaneously with each command.

For memory array 1aa provided are: an X decoder group 2aa selected when a bank address signal BX is activated, for decoding row address signals X0 to Xj (X0–j) for driving an address designated row of memory array 1aa to the selected state; a sense amplifier group 3aa activated when a sense amplifier activating signal φSAA is activated, for sensing, amplifying and latching memory cell data connected to the selected row of memory array 1aa; and a Y decoder group 4aa activated when bank address signal BY is activated, for decoding column address signals YE0 to YEk (YE0–k) for selecting an address designated column of memory array 1aa.

The memory cells on the column selected by Y decoder group 4aa are coupled to an internal data bus 5aa. Bank address signal BX is a bank address signal applied simultaneously with an active command or a precharge command designating return to precharging, while bank address signal BY is a bank address signal applied simultaneously with a read command or a write command.

Memory arrays 1ab, 1ba and 1bb have structures similar to that of memory array 1aa.

Here, the terms "X decoder group", "sense amplifier group" and "Y decoder group" are used as X decoder group includes X decoders arranged corresponding to respective rows, the sense amplifier group includes sense amplifiers provided corresponding to respective columns of the corresponding memory array, and Y decoder group includes Y decoders provided corresponding to respective columns.

In memory arrays 1aa and 1ab, a memory cell selecting operation is performed simultaneously in accordance with bank address signals BX and BY, while in memory arrays 1ba and 1bb, the selecting operation is performed simultaneously in accordance with bank address signals /BX and /BY.

In order to read data from memory array 1aa, a read preamplifier & register 22a receiving data from memory array 1aa read to internal data bus 5aa by sense amplifier group 3aa in response to activation of a register activating signal φRBA0 and amplifying and latching the data is provided.

In order to read data from memory array 1ab, a read preamplifier & register 22b for receiving data from memory array 1ab read by sense amplifier group 3ab to internal data bus 5ab in response to activation of a register activating signal φRBA1 and amplifying and latching the data is provided.

In order to read data from memory array 1ba, a read preamplifier & register 24a for receiving data from memory array 1ba read by sense amplifier group 3ba to internal data bus 5ba in response to activation of a register activating signal φRBB0 and amplifying and latching the data is provided.

In order to read data from memory array 1bb, a read preamplifier & register 24b for receiving data from memory array 1bb read by sense amplifier group 3bb to internal data bus 5bb in response to activation of a register activating signal φRBB1 and amplifying and latching the data is provided.

A bank selector 302a is provided for read preamplifier & registers 22a and 24a. Bank selector 302a selects and outputs either of data signal /DAA0 output from read preamplifier & register 22a and data signal /DAB0 output from read preamplifier & register 24a in accordance with data selecting signals BA0, /BA0, BA1 and /BA1.

A bank selector 302b is provided for read pramplifier & registers 22b and 24b. Bank selectors 302b selects and outputs either of data signals /DAA1 output from read preamplifier & register 22b and data signal /DAB1 output from read preamplifier & register 24b in accordance with bank selecting signals BA0, /BA0, BA1 and /BA1.

For bank selectors 302a and 302b, a prefetch selector 304 for selecting signals from either one of bank selectors 302a and 302b in response to selection signals φSEO and φSEE, an output buffer 28 for receiving and outputting an output from prefetch selector 304 and a data input/output terminal 6 for externally outputting an output signal from output buffer 28 are provided.

The synchronous semiconductor memory device further includes a control signal generating circuit 13 taking external control signals ext./RAS, ext./CAS, ext./CS and ext./WE applied to input terminals 12a, 12b, 12c and 12d, respectively, in synchronization with a rise of clock signal CLK, and inverting states of the signals to generate internal control signals φxa, φya, φW, φCS, φR and φCA.

The signal ext./CS is a chip select signal, and when the chip select signal ext./CS is in the active state, the synchronous semiconductor memory device inputs/outputs data.

The clock signal CLK is a clock signal internally generated in accordance with the external clock signal ext.CLK.

The signal φxa is activated when an active command is applied, and it designates taking of a row address signal. The signal φya is activated when a read command or a write command is applied, and designates taking of a column address signal. The signal φW is activated when a write command is applied, and designates data writing.

The signal φR is activated when an active command is applied, for designating activation of circuitry at portions related to row selection.

The signal φCA is activated when a read command or a write command is applied, for designating activation of circuitry (column related circuitry) at portions related to column selection and data input/output.

The synchronous semiconductor memory device further includes: an X address buffer 14 responsive to activation of row address taking designating signal φxa for taking external address signals ext.A0 to Ai (A0–i) and generating row address signals X0 to Xj (X0–j) and bank address signal BX; a Y address buffer 15 activated when column address taking designating signal φya is activated for taking external address signals ext.A0 to Ai for generating an internal column address signal; and a Y address operation circuit 16 changing the internal column address signal applied from Y address buffer 15 as a leading address in a prescribed sequence in synchronization with the clock signal CLK for generating even-numbered column address signals YE0 to YEk (YE0–k), odd-numbered column address signals YO0 to YOk (YO0–k) and bank address signals BY, BA0, BA1 (BA0, 1), BA0, /BA1 (/BA0, 1).

Y address operation circuit 16 includes a burst address counter, and causes transition of the column address signal in every two clock cycles. The synchronous semiconductor memory device further includes: a clock counter 17 for counting the internal clock signal CLK in accordance with activation of column related circuitry activating signal φCA and generating a count up signal at a prescribed timing in accordance with the count value; and a control signal generating circuit 32 receiving the count up signal from clock counter 17, bank address signals BX and BY and the least significant bit Y0 of the column address signal for generating various internal control signals φRBB0, φRBB1, φRBA0, φRBA1, φSEO, φSEE, int.RAS0, int.RAS1, RASpulse, RXTpulse, S0Npulse and S0Ppulse.

Signals int.RAS0 and int.RAS1 are internal row address strobe signals for the banks A and B, respectively.

The signal RXTpulse is for designating timing of word line selection and activation.

The signals S0Npulse and S0Ppulse are signals for designating timings of sense amplifier activation.

In accordance with bank address signals BX and BY, a control signal to the designated bank is set to the active state. The least significant column address signal bit Y0 is used for indicating which of the two memory arrays belonging to one bank is to be accessed first.

Clock counter 17 includes a count for counting CAS latency and the burst length, and generates a count up signal at a prescribed timing in accordance with a designated operation mode.

The SDRAM 1000 further includes: a bank control signal generating circuit 200.0 provided corresponding to bank A, receiving signals int.RAS0, RXTpulse, S0Npulse and/ S0Ppulse for outputting signals RXT0 and φSAA for controlling the operation of bank A; and a bank control signal generating circuit 200.1 provided corresponding to bank B, receiving signals int.RAS1, RXTpulse, S0Npulse and S0Ppulse for outputting signals RXT1 and φSAB for controlling the operation of bank B.

The signal RXT0 is for activating word line selecting operation of bank A, and the signal RXT1 is for activating word line selecting operation of bank B.

The signal φSAA is for activating sense amplifiers of bank A, and it includes an N channel sense amplifier activating signal S0N0 and a P channel sense amplifier activating signal /S0P0.

The signal φSAB is for activating sense amplifiers of bank B, and it includes an N channel sense amplifier activating signal S0N1 and a P channel sense amplifier activating signal /S0P1.

In FIG. 1, circuitry related to writing is not shown.

The feature of the synchronous semiconductor memory device resides in that each bank is divided into two sub banks and read preamplifiers, registers and so on are provided corresponding to the respective sub banks. Therefore, the numbers of read preamplifiers, registers and so on are twice those of the common SDRAM. Though 2 bank configuration is shown as an example in FIG. 1, generally, a configuration in which n (n: natural number) banks can be accessed independent from each other is possible.

Figure 2:
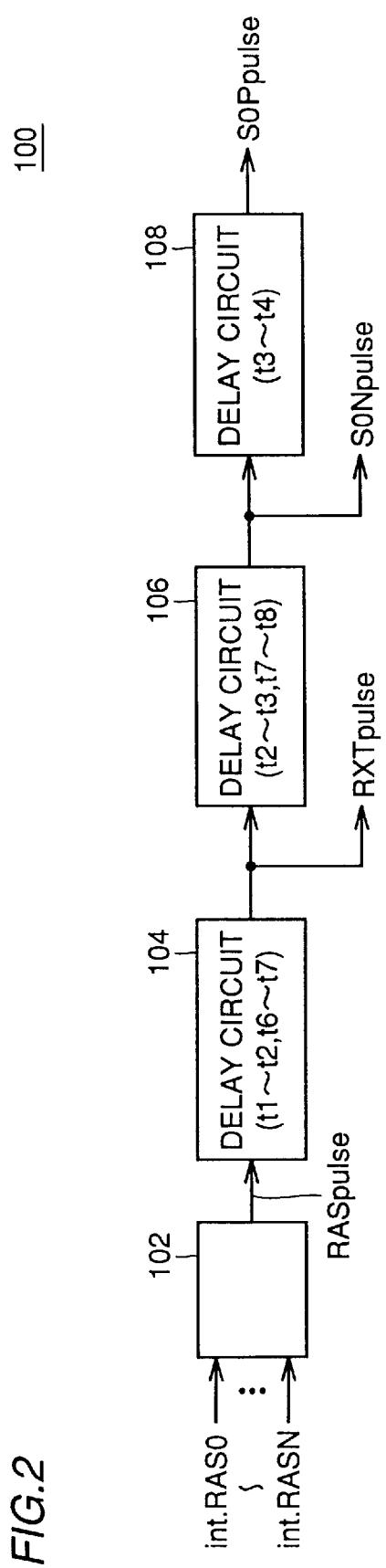
FIG. 2 is a schematic block diagram illustrating configuration of a delay control signal generating circuit 100.

FIG. 2 is a schematic block diagram showing configuration of delay signal generating circuit 100 included in control signal generating circuit 32 shown in FIG. 1.

In the following, description will be given assuming that there are (N+1) banks from bank0 to bankN, in general.

Delay signal generating circuit 100 is provided common to all the banks 0 to N, for generating a delay signal which is a trigger for generating control signals to the banks 0 to N.

As already described, in the plural bank configuration, a delay circuit necessary for generating signals controlling activation/inactivation of respective banks requires large area. Therefore, only one delay circuit 100 necessary for generating signals controlling activation and inactivation of the banks is provided, which delay circuit is shared by the plurality of banks as shown in FIG. 2, and a circuit occupying a small area such as an SR flip-flop circuit (hereinafter referred to as SR-FF) is provided for each bank, whereby increase in chip area is suppressed.

Figure 6:
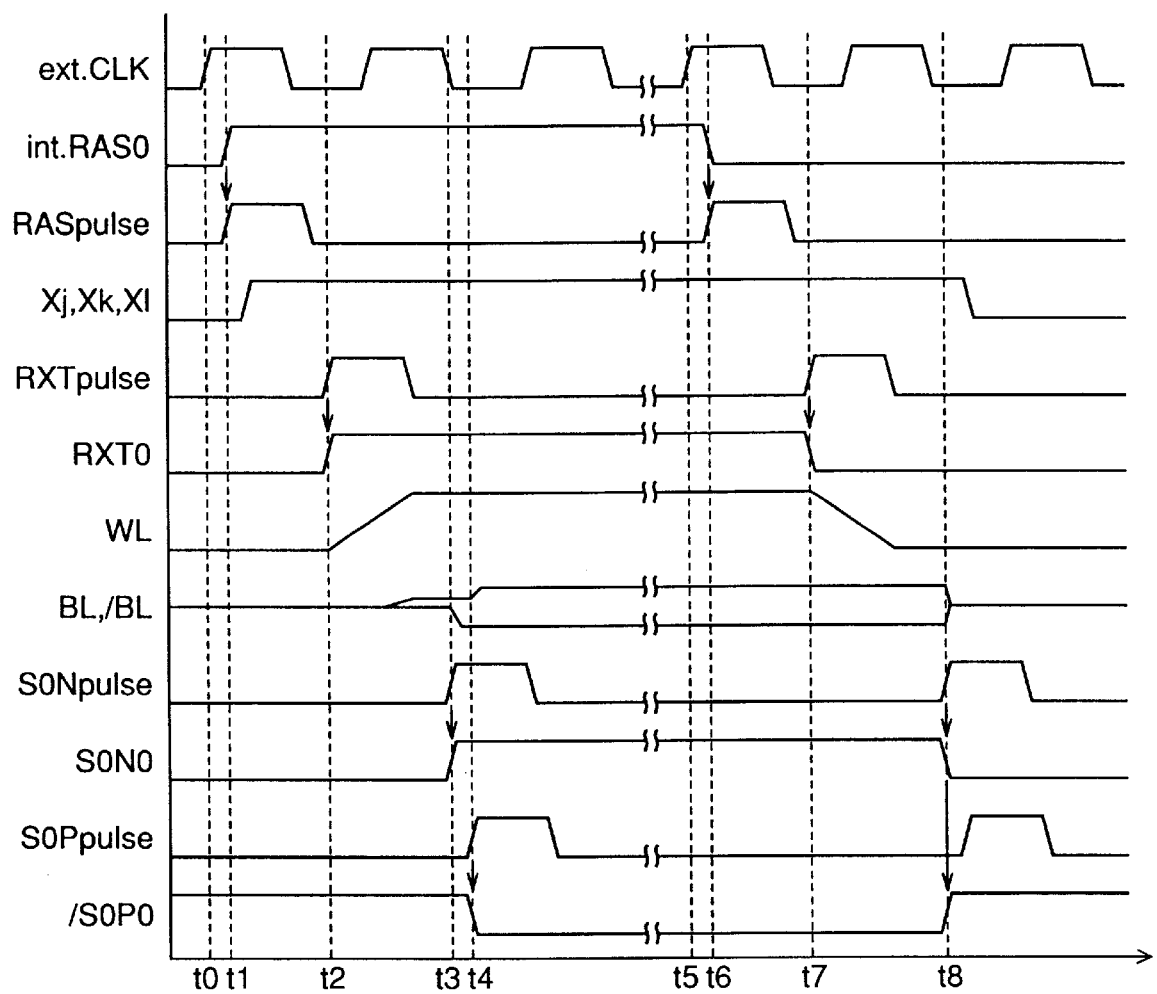
FIG. 6 is a timing chart related to operations of delay control signal generating circuit 100 and bank control signal generating circuit 200.

Delay control signal generating circuit 100 includes: a row strobe pulse signal generating circuit 102 for generating a RASpulse having a prescribed activation period based on internal row address strobe signals int.RAS0 to int.RASN generated in the second control signal generating circuit 32 in response to the signal φR generated by the first control signal generating circuit 13 in response to activation of the signal ICS and the external row address strobe signal /RAS as well as to the selected bank address; a delay circuit 104 receiving the signal RASpulse, delaying the signal by a prescribed time period (the period from t1 to t6 or the period from t6 to t7 shown in FIG. 6, which will be described later), for outputting the signal RXTpulse; a delay circuit 106 receiving the signal RXTpulse, delaying the signal by a prescribed period (the period from t2 to t3 or from t7 to t8 of FIG. 6) to provide sense amplifier activating signal S0Npulse; and a delay circuit 108 receiving the signal S0Npulse, delaying the signal by a prescribed period (the period from t3 to t4 of FIG. 6) to provide sense amplifier activating signal S0Ppulse.

Figure 3:
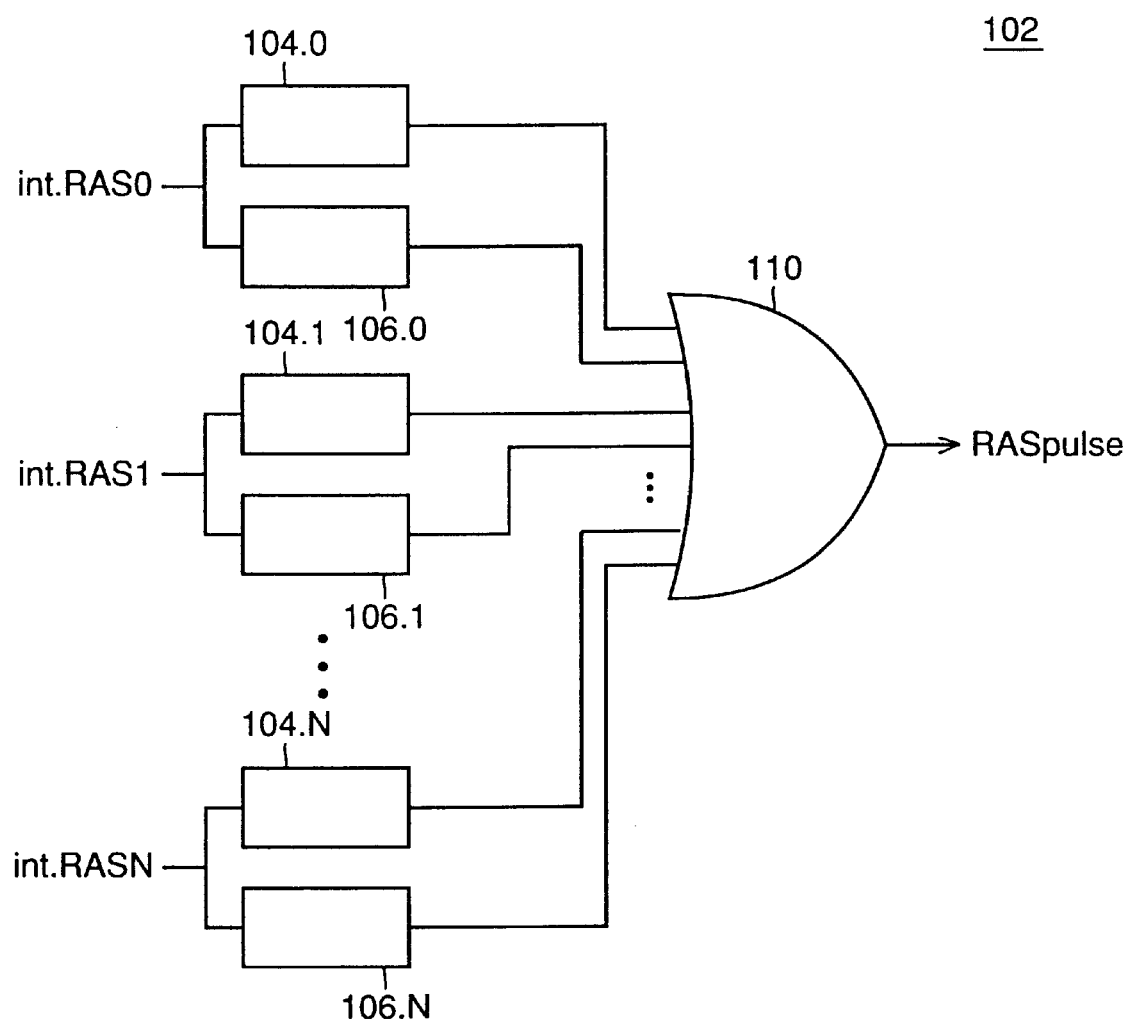
FIG. 3 is a schematic block diagram illustrating configuration of a row strobe pulse signal generating circuit 102.

FIG. 3 is a schematic block diagram showing the configuration of row strobe pulse signal generating circuit 102.

Row strobe pulse signal generating circuit 102 includes: rise detecting circuit 104.0 to 104.N responsive to activation (transition from "L" level to "H" level) of corresponding internal row address strobe signals int.RAS0 to int.RASN for generating a pulse signal of a prescribed time width, respectively; fall detecting circuits 106.0 to 106.N receiving inactivation (transition from "H" level to "L" level) of the corresponding internal row address strobe signals int.RAS0 to int.RASN for generating a pulse signal of a prescribed time width respectively; and an OR gate 110 receiving outputs from the rise detecting circuits 104.0 to 104.N and outputs from the fall detecting circuits 106.0 to 106.N for outputting logical sum thereof as the signal RASpulse.

Figure 4:
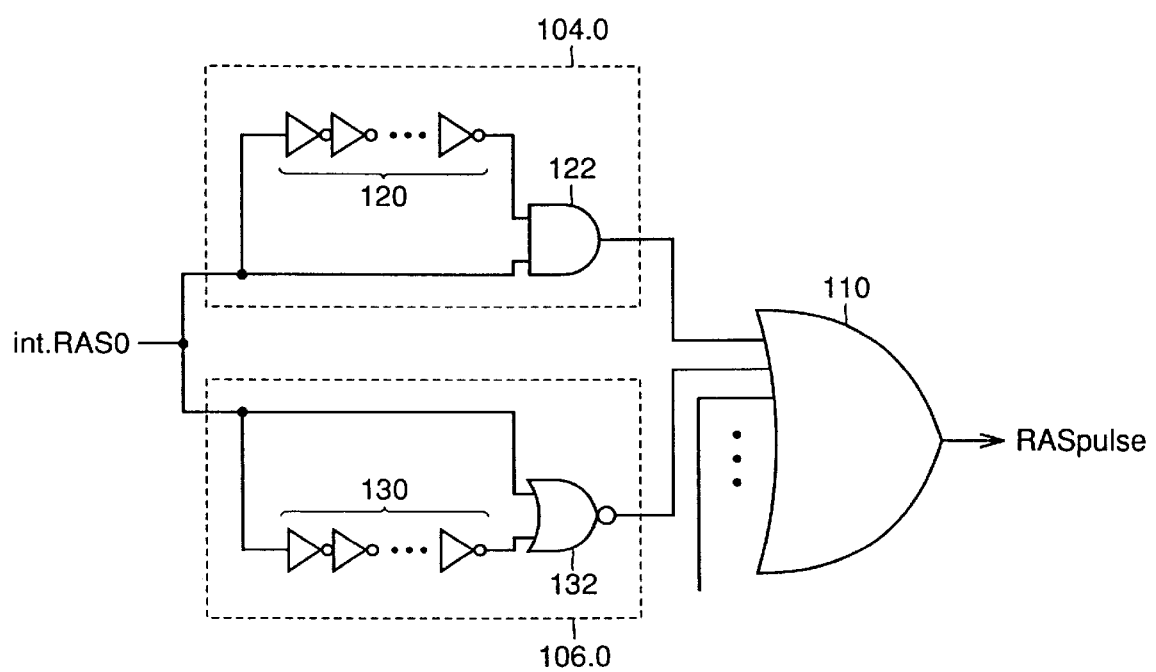
FIG. 4 is a schematic block diagram illustrating configurations of a rise detecting circuit 104.0 and a fall detecting circuit 106.0 shown in FIG. 3.

FIG. 4 is a schematic block diagram showing the configurations of rise detecting circuit 104.0 and fall detecting circuit 106.0 shown in FIG. 3.

Rise detecting circuit 104.0 includes an odd-numbered stages of inverters 120 connected in series with each other and receiving the signal int.RAS0, and an AND gate 122 receiving an output from the series of inverters 120 and the signal int.RAS0.

Fall detecting circuit 106.0 includes an odd-numbered stages of inverters 130 connected in series with each other and receiving the signal int.RAS0, and an NOR gate 132 receiving an output from the series of inverters 130 and the signal int.RAS0.

Rise detecting circuits 104.1 to 104.N and fall detecting circuits 106.1 to 106.N have basically the same configurations as rise detecting circuit 104.0 and fall detecting circuit 106.0, respectively, except that input signals are different.

Figure 5:
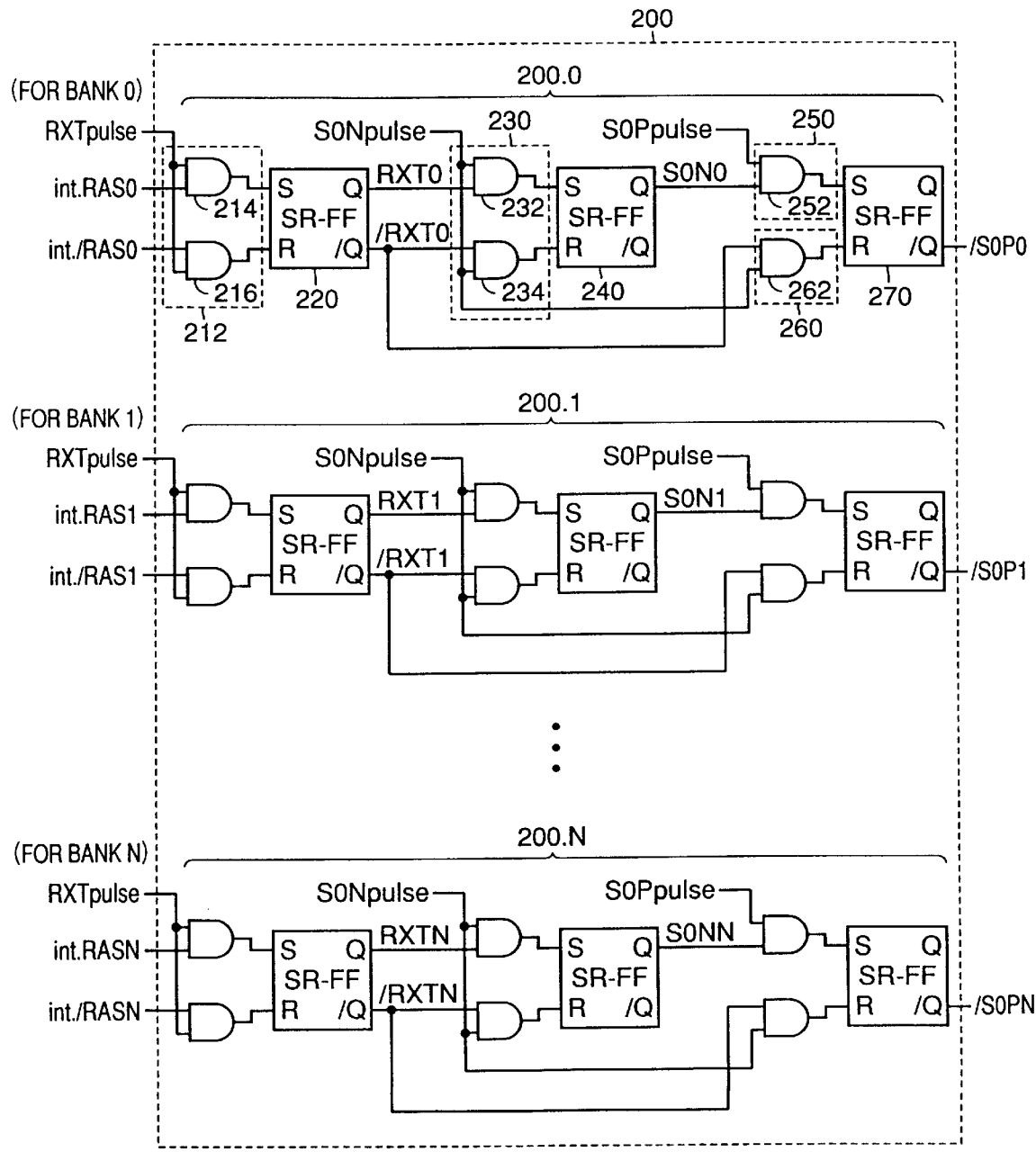
FIG. 5 is a schematic block diagram illustrating configuration of a bank control signal generating circuit 200.

FIG. 5 is a schematic block diagram showing the configuration of bank control signal generating circuit 200 receiving internal row address strobe signals int.RAS0 to int.RASN, pulse signals RXTpulse, S0Npulse and S0Ppulse output from delay control signal generating circuit 100 for outputting control signals to respective banks.

Bank control signal generating circuit 200 includes internal control circuits 200.0 to 200.N provided corresponding to bank0 to bankN, respectively.

As will be described in the following, (N+1) internal control circuits 200.0 to 200.N basically have the same configuration except that the input signals are the corresponding internal row address strobe signals int.RAS0, int./RAS0, . . . , int.RASN and int./RASN, respectively.

Therefore, in the following only the configuration of internal control circuit 200.0 provided for bank0 will be described.

Internal control circuit 200.0 includes: an input control circuit 212 taking the internal row address strobe signal int.RAS0 and inverted signal int./RAS0 at the timing of activation of the signal RXTpulse; an SR-FF circuit 220 which is set and reset in accordance with an output from input control circuit 212; a transmission control circuit 230 for outputting a signal in accordance with the levels of an output signal RXT0 from the SRFF circuit and of the inverted signal /RXT0 at the timing of activation of the signal S0Npulse; an SR-FF circuit 240 which is set and reset receiving an output from transmission control circuit 230; a transmission control circuit 250 receiving a signal S0N0 output from SR-FF circuit 240 and transmitting the same at the timing of the signal S0Ppulse; a transmission control circuit 260 for transmitting, at the timing of activation of the signal S0Npulse the level of signal /RXT0 of the output of SR-FF circuit 220; and an SR-FF circuit 270 which is set by an output from transmission control circuit 250, reset by the output from transmission control circuit 260 and outputting the signals /S0P.

Input control circuit 212 includes an AND circuit 214 receiving the signal RXTpulse at one input node and the signal int.RAS0 at the other input node, and an AND circuit 216 receiving the signal RXTpulse at one input node and int/RAS0 at the other input node.

Transmission control circuit 230 includes an AND circuit 232 receiving the signal S0Npulse at one input node and the signal RXT0 at the other input node, and an AND circuit 234 receiving the signal S0Npulse at one input node and the signal /RXT0 at the other input node.

Transmission control circuit 250 includes an AND circuit 252 receiving the signal S0Ppulse at one input node and the signal S0N0 output from SR-FF circuit 240 at the other input node. Transmission control circuit 260 includes an AND circuit 262 receiving the signal S0Npulse at one input node and the signal /RXT0 at the other input node.

FIG. 6 is a timing chart illustrating operations of delay control signal generating circuit 100 shown in FIG. 2 and bank control signal generating circuit 200 shown in FIG. 5.

In the following, an operation when bank0 is selected will be described.

Referring to FIG. 6, at the rising edge of external clock signal ext.CLK at time t0, when ACT command is input to SDRAM 100, internal row address strobe signal int.RAS0 attains to the "H" level at time t1.

In response to activation of the internal row address signal int.RAS0, an external row address signal is taken in SDRAM and latched with its value established as internal row address signals RAD, /RAD. In response to activation of the signal int.RAS0, an active pulse signal RASpulse is generated from row strobe pulse generating circuit 102. At this time, the widths of pulse signal generated from delay circuits 104, 106 and 108 are adjusted such that the pulse signals RASpulse, RXTpulse, S0Npulse and S0Ppulse generated before and after are not overlapped with each other.

In accordance with a logical product of the signal RXTpulse generated by delaying the signal RASpulse to time t2 and the signal int.RAS0, a set signal is input to SR-FF circuit 220. In response, the output signal RXT0 of SR-FF circuit 220 makes a transition to the active state ("H" level).

Thereafter, a level of a logical product of the sense amplifier activating signal S0Npulse obtained by delaying the signal RXTpulse to time t3, and the signal RXT0 is applied as the set signal to SR-FF circuit 240, and the level of the output signal S0N0 of SR-FF circuit 240 is set to the active state ("H" level).

Further, a set signal generated in accordance with the logical product of the signal S0Ppulse generated by delaying the signal S0Npulse to time t4 and the signal S0N0 is applied to SR-FF circuit 270, and the output signals /S0P0 of SR-FF circuit 270 makes a transition to the active state ("L" level).

In response to the operation from time t0 to time t4, the potential level of word line WL rises, and the change in potential level in accordance with the stored data in the memory cell appearing on bit line BL is amplified by the sense amplifier.

When a PCG command (precharge command) is externally applied at a rising edge of external clock signal ext.CLK at time t5, internal row address strobe signal int.RAS is set to the inactive state ("L" level) at time t6 and, in response, the circuit 102 generates RASpulse, which is applied to delay circuit 104.

In accordance with the logical product of the signal RXTpulse which is the signal RASpulse delayed to the time t7 and the signal int./RAS, a reset signal is applied to SR-FF circuit 220, and the output signal RXT0 of SR-FF circuit 220 makes a transition to the inactive state ("L" level).

Thereafter, in accordance with the logical product of the sense amplifier activating signal S0Npulse provided by delaying the signal RXTpulse to time t7 and the signal RXT0, a reset signal is applied to SR-FF circuit 240. In response, the output signal S0N0 of SR-FF circuit 240 makes a transition to the "L" level, and the signal /S0P0 which is an output signal of SR-FF circuit 270, to which a reset signal is applied in accordance with the logical product between signals S0Npulse and /RXT0, makes a transition to the inactive state ("H" level).

In this manner, the word line WL falls, the data which has been appearing on the bit line BL is stored again, and thereafter the sense amplifier is inactivated.

As described above, by combining pulse signals delayed successively and the source signals in the delay circuit, it is possible to successively generate control signals corresponding to respective banks, delayed by desired time periods.

Activating and inactivating operations for the plurality of banks will be described in the following.

Figure 7:
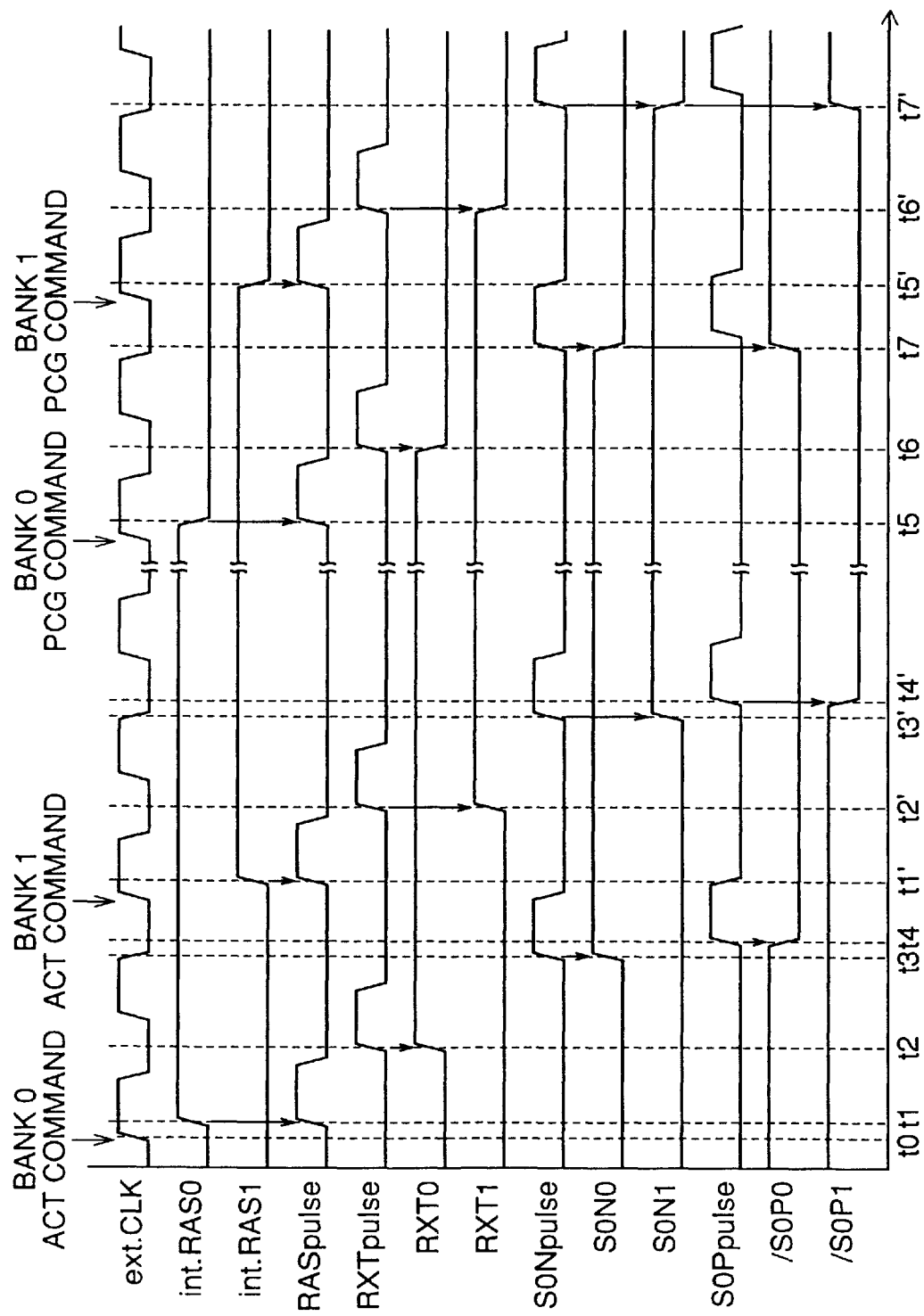
FIG. 7 is a timing chart related to the operation of activating/inactivating a plurality of banks in the SDRAM 1000 in accordance with the first embodiment.

FIG. 7 is a timing chart related to the operation of activating/inactivating the plurality of banks.

First, at time t0, when ACT command is input for bank0, at time t1, internal row address strobe signal int.RAS0 attains to the "H" level and, in response, the pulse signal RASpulse is generated.

Thereafter, at time t2, in response to the pulse signal RXTpulse, the signal RXT0 attains to the "H" level. At this time, the internal row address strobe signal int.RAS1 corresponding to bank 1 is kept inactive ("L" level), and therefore the signal RXT1 corresponding to bank 1 is kept at the "L" level, even when the signal RXTpulse is received.

Further, at time t3, in response to activation of sense amplifier activating signal S0Npulse, the level of the signal S0N0 attains to the "H" level, and at time t4, in response to activation of the signal S0Ppulse, the sense amplifier activating signal /S0P0 for the bank0 attains to the active state ("L" level).

In contrast, as to bank 1, even when the corresponding internal control circuit 230 receives the signals S0Npulse and S0Ppulse, the sense amplifier activating signal S0N1 for the bank 1 is kept inactive ("L" level), and sense amplifier activating signal /S0P is also inactive ("H" level).

In this manner, the operation of amplifying data stored in the memory cell by the sense amplifier, with the word line WL0 of bank0 raised, takes place.

After activation of bank0, when the ACT command to the bank 1 is input, at time t1', the first control signal generating circuit 13 sets internal row address strobe signal int.RAS 1 for bank 1 to the active state ("H" level). In response, the circuit 102 generates an active signal RASpulse, and at time t2', in response to the signal RXTpulse output from delay circuit 104, the signal RXT1 attains to the active state ("H" level) in internal control circuit 230.

At this time, the internal row address strobe signal int.RAS0 for bank0 has already been activated ("H" level), and therefore upon reception of the signal RXTpulse, SR-FF circuit 220 in internal control circuit 210 makes an attempt to set the level of output signal RXT0 to the active state ("H" level). The signal level, however, is kept at the active state ("H" level), as it has been already set to the "H" level at time t2. Further, at time t3', the signal S0N1 output from internal control circuit 230 from the pulse signal S0Npulse output from delay circuit 106 attains to the active state ("H" level), and at time t4', in response to the signal S0Ppulse output from delay circuit 108, sense amplifier activating signal /S0P1 for bank 1 is set to the active state ("L" level).

As to bank0, receiving signals S0Npulse and S0Ppulse, SR-FF circuits 240 and 270 make an attempt to set the output signal S0N0 to "H" level and the signal /S0P0 to "L" level. The sense amplifier activating signals S0N0 and /S0P0 for bank0, however, are maintained, as the signal S0N0 has already been set to the "H" level and the signal /S0P at "L" level, at time points t3 and t4.

In this manner, the word line WL0 of bank 1 is raised following bank0, and the operation of amplifying the data stored in the memory cell by the sense amplifier is performed.

When the PCG command for bank0 is input as shown in FIG. 5 with bank0 and bank1 both activated, at time t5 the internal row address strobe signal int.RAS0 for bank0 is set to the inactive state ("L" level), and, in response, the circuit 102 generates the signal RASpulse. At time t6, in response to the signal RXTpulse output from delay circuit 104, the signal RXT0 for bank0 makes a transition to "L" level.

At this time, the internal row address strobe signal int.RAS1 of bank 1 is kept at the active state of "H" level, and even when the signal RXTpulse is received, the signal RXT1 is kept at the "H" level.

Further, at time t7, by the signal S0Npulse output from delay circuit 106, the output signal S0N0 from the SR-FF circuit attains to the "L" level, and the output signal /S0P0 of SR-FF circuit 270 attains to the "H" level.

By contrast, in bank 1, even when the pulse signal S0Npulse from delay circuit 106 is received, the sense amplifier activating signal S0N1 is kept at the active state ("H" level), and the signal /S0P1 is kept at the active state ("L" level), for bank1. In this manner, the word line of bank 1 is kept at the "H" level, the data which has been appearing on bit line BL is stored in the memory cell with the word line WL0 of bank0 lowered, and the sense amplifier for bank0 is inactivated.

Next, when the PCG command for the bank1 is input, at time t5' the internal row address strobe signal int.RAS1 for bank1 is set to the inactive state ("L" level), and in response, the circuit 102 generates RASpulse. At time t6', by the pulse signal RXTpulse from delay circuit 104, the signal RXT1 is set to the inactive state ("L" level) in internal control circuit 230.

At this time, the signal int.RAS0 of bank0 has already been at "L" level, and therefore even when the signal RXTpulse from delay circuit 104 is received, the signal RXT0 in internal control circuit 210 is maintained at the inactive state ("L" level).

Further, at time t7', by the signal S0Npulse output from delay circuit 106, sense amplifier activating signal S0N1 is set to the inactive state ("L" level) in internal control circuit 230, and sense amplifier activating signal /S0P1 is also set to the inactive state ("H" level).

By contrast, for the bank0, at time t7, the signal S0N0 has already been at the "L" level at time t7, and the signal /S0P0 is at the "H" level. Therefore, even when the signal S0Npulse from delay circuit 106 is received, internal control circuit 210 is kept at the same state.

In this manner, the word line WL of bank 1 is lowered following bank0, the data which has been appearing on bit line BL is stored in the memory cell, and thereafter, the sense amplifier is inactivated.

As described above, by utilizing the configurations of delay control signal generating circuit 100 and bank control signal generating circuit 200 which are the circuits for generating signals controlling activation and inactivation of the banks as shown in FIGS. 2 and 5, increase in chip area can be suppressed in the plural bank configuration such as employed in the SDRAM 1000.

More specifically, the delay circuit having relatively large area of occupation necessary for generating control signals to respective ones of the plurality of banks is shared by the plurality of banks, and each bank is provided with a circuit have relatively small area of occupation such as SR-FF circuits 220, 240 and 270, so as to enable control bank by bank.

Though signals controlling activation and inactivation of each bank have been described above, the present invention is not limited thereto. When the delay circuit occupying a large area on the chip is shared by the plurality of banks in relation to other control signals necessarily generated for respective banks, it is possible to suppress increase in chip area.

Second Embodiment

In the SDRAM 1000 in accordance with the first embodiment, (N+1) internal control circuits 210 to 250 corresponding to bank0 to bankN share one delay control signal generating circuit 100, so as to suppress increase in chip area.

In the SDRAM in accordance with the second embodiment, in the SDRAM having N (N>2) bank configuration, two such delay circuits that is necessary for generating the signals controlling activation and inactivation of the banks and occupying large area are provided and used switched from each other, shared by N banks.

For each bank, an internal control circuit implemented by a circuit having relatively small area of occupation such as the SR-FF circuits is provided to generate the control signal corresponding to the bank. In this manner, the present invention contemplates the SDRAM which suppresses increase in chip area and ensures large operation margin.

As already described, the SDRAM of plural bank configuration takes various commands therein, in synchronization with the externally input clock signal ext.CLK. The timings of various commands at that time are specified as operation specification of the SDRAM. There is no specification, however, as to the timing between the ACT command for a certain bank and the PCG command for another bank, or between the PCG command for a certain bank and the PCG command for another bank.

Therefore, it is possible to input these commands in continuous cycles.

Therefore, when the configuration of SDRAM 1000 in accordance with the first embodiment is used and when the ACT command and PCG command, for example, are input in continuous cycles in a high speed operation, there may possibly be a problem that a margin with respect to pulse signals input to the delay circuit would be too small for the preceding and succeeding cycles.

Figure 8:
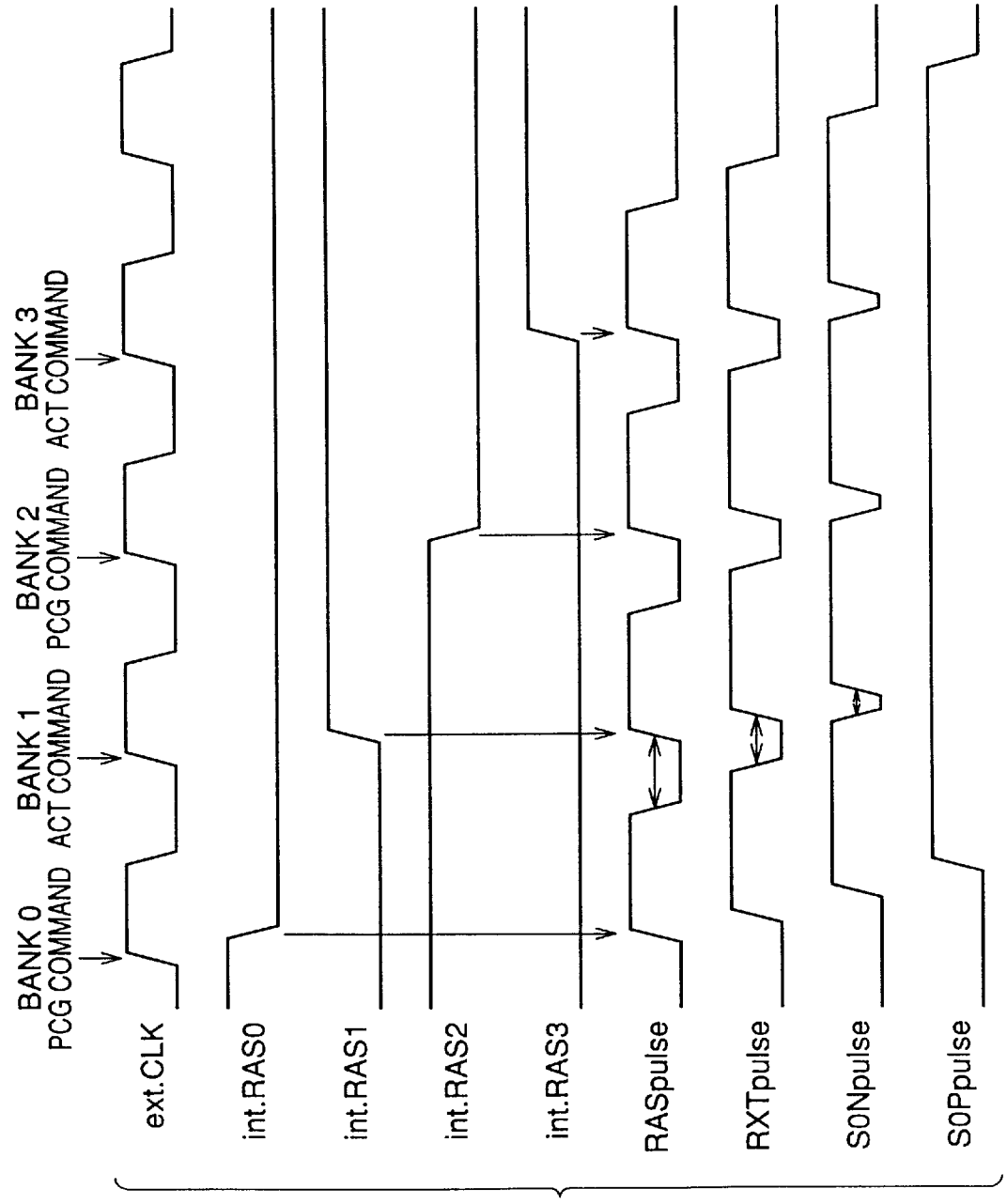
FIG. 8 is a timing chart related to an operation when commands are input in continuous cycles in high speed operation.

FIG. 8 is a timing chart showing an operation when the ACT command and the PCG command are input in continuous cycles in high speed operation, in the SDRAM having 4-bank configuration, which is comparable to the configuration of the first embodiment.

A pulse signal input to delay control signal generating circuit 100 such as described with respect to the first embodiment may have each waveform made less sharp as it passes through delay circuits 104, 106 and 108 each having relatively large amount of delay, and if the pulse signal width is thin, the pulse signal may be lost in the worst case.

Therefore, the pulse signal width cannot be made too short, in order to ensure operation margin. However, when the commands are input in continuous cycles in a high speed operation as shown in FIG. 8, when a pulse signal is input to delay control signal generating circuit 100 while maintaining a pulse signal width of a certain extent, the width of "L" level of preceding and succeeding pulse signals is made narrow. More specifically, as the pulse signal passes through delay circuits 104 to 108 having large amount of delay, the waveform of the pulse signal would be made less sharp and possibly be overlapped with preceding or succeeding pulse signal.

Therefore, in the SDRAM in accordance with the second embodiment, two sets of delay circuits, necessary for generating signals controlling activation and inactivation of the banks and occupying large area are provided and used switched from each other, so as to prevent overlapping of preceding and succeeding pulse signals, in the SDRAM of N bank configuration.

Figure 9:
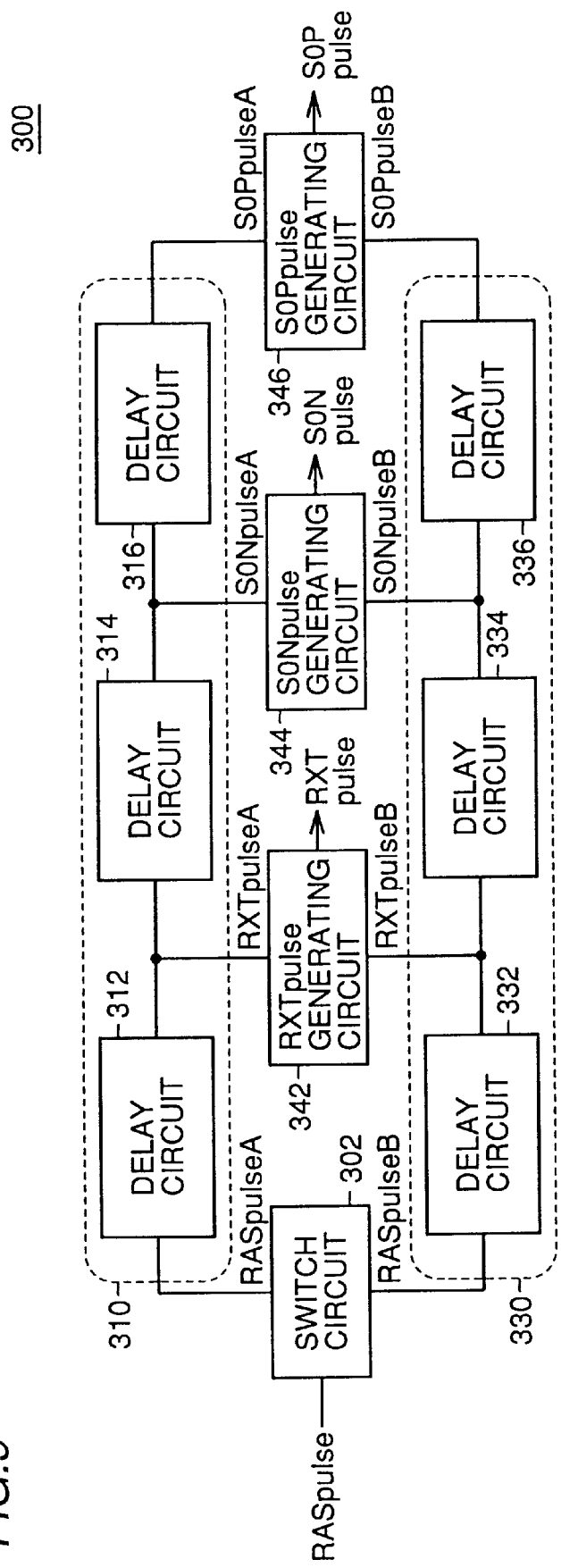
FIG. 9 is a schematic block diagram illustrating configuration of a delay control signal generating circuit 300 in accordance with a second embodiment of the present invention.

FIG. 9 is a schematic block diagram showing configuration of the delay control signal generating circuit 300 in accordance with the second embodiment of the present invention.

Delay control signal generating circuit 300 includes: a switch circuit 302 receiving a pulse signal RASpulse generated in response to activation of external row address strobe signal ext.RAS and outputting signals RASpulseA and RASpulseB output allocated to two output nodes successively; a timing signal generation circuit 310 receiving the signal RASpulseA output from switch circuit 302, timing signal generation the signal by prescribed time periods to provide signals RXTpulseA, S0NpulseA and S0PpulseA; a delay circuit 330 receiving the pulse signal RASpulseB output from switch circuit 302, delaying the signal by prescribed time periods to provide signals RXTpulseB, S0NpulseB and S0PpulseB; an RXTpulse generating circuit 342 receiving the signal RXTpulseA from timing signal generation circuit 310 and the signal RXTpulseB from timing signal generation circuit 330, responsive to activation of either one of these signals to output the signal RXTpulse having a pulse length of a prescribed time width; an S0Npulse generating circuit 344 receiving the signal S0NpulseA from timing signal generation circuit 310 and the signal S0NpulseB from timing signal generation circuit 330 for generating the signal S0Npulse having a pulse width of a prescribed time period; and an S0Ppulse generating circuit 346 receiving the signal S0PpulseA from delay circuit 310 and the signal S0PpulseB from delay circuit 330 for outputting the signal S0Ppulse having the pulse width of a prescribed time period.

Timing signal generation 312 circuit includes an internal delay circuit 312 receiving the signal RASpulseA, delays the signal by a prescribed time period for outputting the signal RXTpulseA; an internal delay circuit 314 receiving the signal RXTpulseA, delaying the signal for a prescribed time period and outputting the signal S0NpulseA; and an internal delay circuit 316 receiving the signal S0Npulse, delaying the signal by a prescribed time period and outputting the signal S0PpulseA.

Timing signal generation circuit 330 also includes internal delay circuits 332, 334 and 336 which are equivalent to the internal delay circuits 312, 314, and 316 of timing signal generation circuit 310, respectively.

Internal delay circuit 332 receives the signal RASpulseB and outputs the signal RXTpulseB. Delay circuit 334 receives the signal RXTpulseB and outputs the signal S0NpulseB. Internal delay circuit 336 receives the signal S0NpulseB and outputs the signal S0PpulseB.

In the second embodiment also, the signal RASpulse is generated by a circuit similar to the row strobe pulse generating circuit 102 in accordance with the first embodiment.

Figure 10:
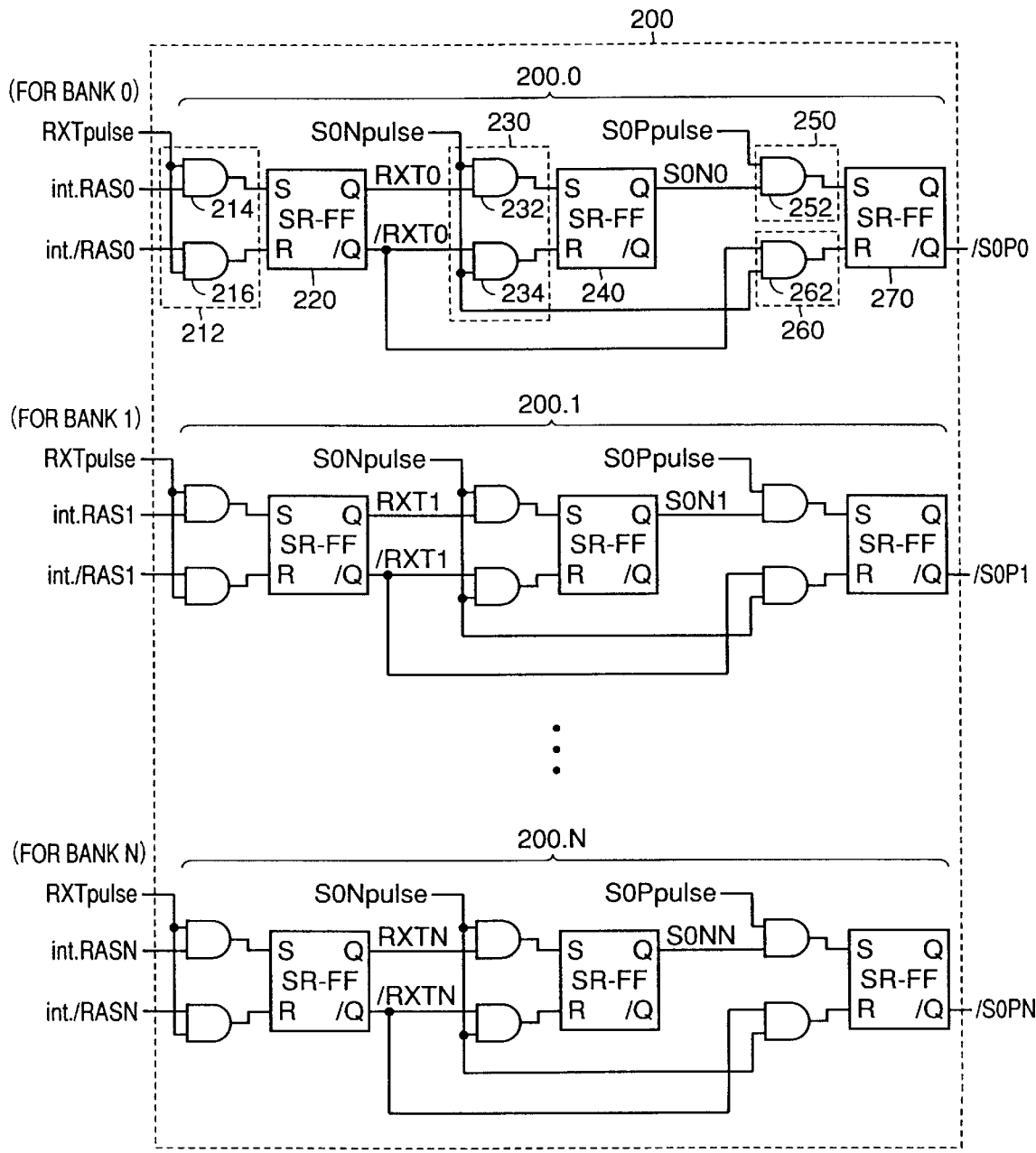
FIG. 10 is a schematic block diagram illustrating configuration of the bank control signal generating circuit 200 in accordance with the second embodiment of the present invention.

FIG. 10 is a schematic block diagram showing configuration of the bank control signal generating circuit 200 provided corresponding to bank0 to bankN, respectively, in the SDRAM in accordance with the second embodiment. In the second embodiment, the configuration of the bank control signal generating circuit is similar to that of the bank control signal generating circuit 200 in accordance with the first embodiment. Therefore, corresponding portions are denoted by the same reference characters and description thereof is not repeated.

Figure 11:
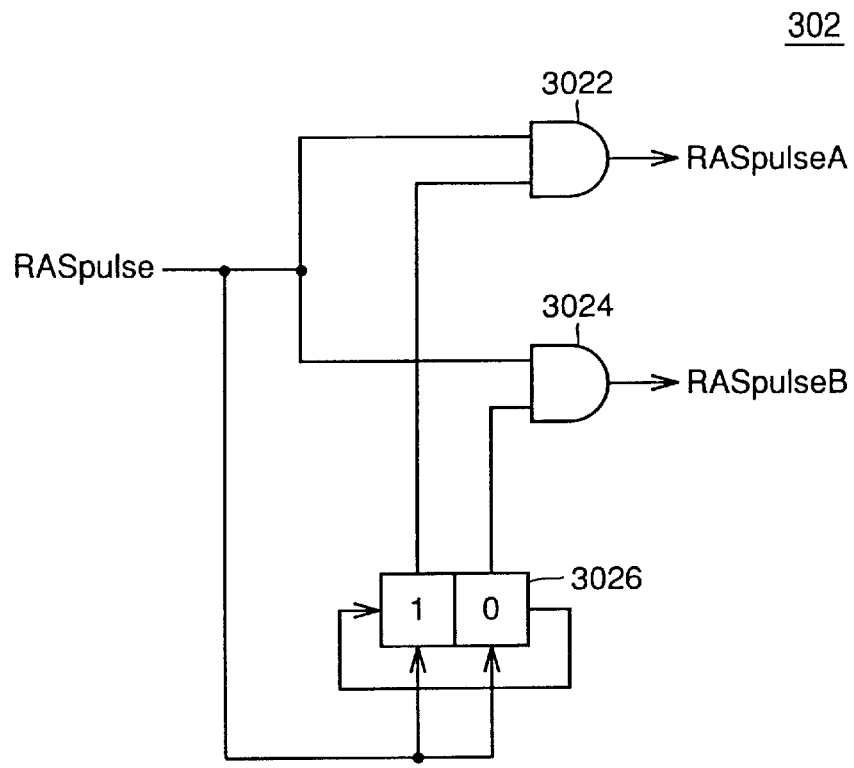
FIG. 11 is a schematic block diagram illustrating configuration of switch circuit 302 shown in FIG. 9.

FIG. 11 is a schematic block diagram showing the configuration of switch circuit 302 shown in FIG. 9.

Switch circuit 302 includes: a ring counter 3026 circulating 2 bits of data "10" using the input signal RASpulse as a clock signal; an AND gate 3022 receiving a higher bit of the ring counter at a first input node and the signal RASpulse at a second input node for outputting the signal RASpulseA; and an AND gate 3024 receiving a lower bit of the ring counter at a first input node and the signal RASpulse at a second input node for outputting the signal RASpulseB.

Figure 12:
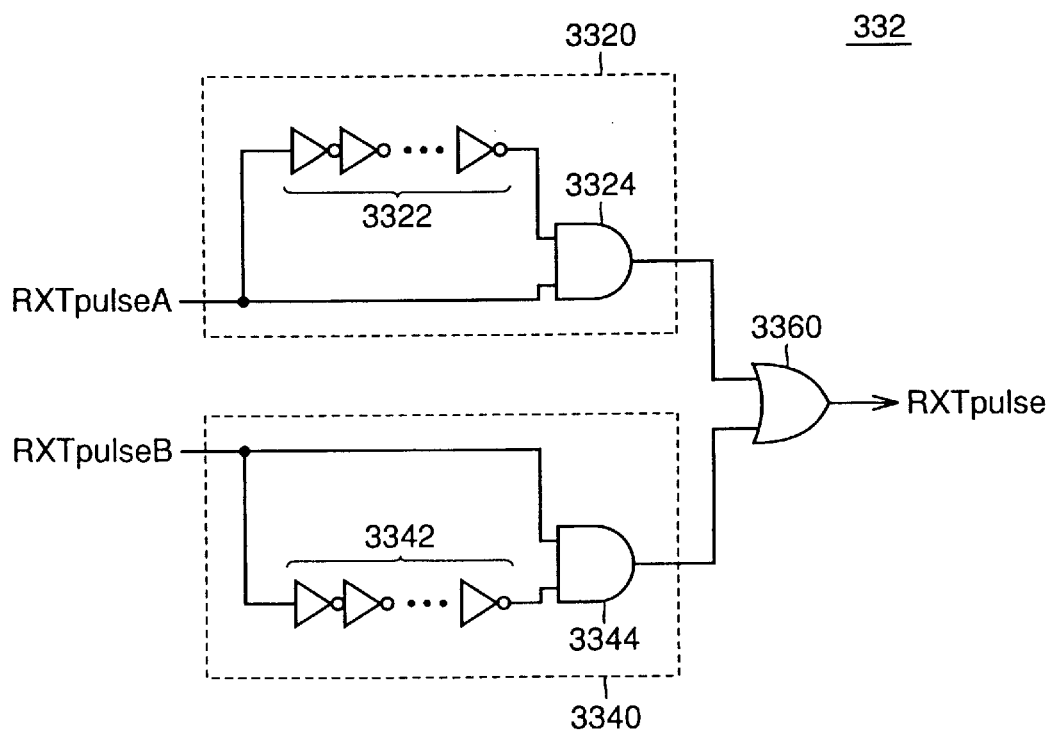
FIG. 12 is a schematic block diagram illustrating configuration of an RXTpulse generating circuit 342 shown in FIG. 9.

FIG. 12 is a schematic block diagram showing configuration of the RXTpulse generating circuit 342 shown in FIG. 9.

RXTpulse generating circuit 342 includes a rise detecting circuit 3320 for outputting a signal of a prescribed pulse length in response to activation of the signal RXTpulseA, a rise detecting circuit 3340 outputting a signal of a prescribed pulse length in response to activation of the signal RXTpulseB, and an OR gate 3360 receiving outputs from rise detecting circuits 3320 and 3340 for outputting the signal RXTpulse.

Rise detecting circuit 3320 includes an odd-numbered stages of inverters 3320 connected in series with each other and receiving the signal RXTpulseA, and an AND circuit 3324 receiving an output from the series of inverters 3322 and the signal RXTpulseA.

Rise detecting circuit 3340 includes an odd-numbered stages of inverters 3340 connected in series with each other and receiving the signal RXTpulseB, and an AND gate 3340 receiving an output from the series of inverters 3342 and the signal RXTpulseB.

By the above described configuration, the signal RXTpulse having a pulse width of a prescribed length is generated, regardless of the pulse lengths of the input signals RXTpulseA and RXTpulseB.

Other S0Npulse generating circuit 344 and S0Ppulse generating circuit 346 also have the similar structure as RXTpulse generating circuit 342.

Figure 13:
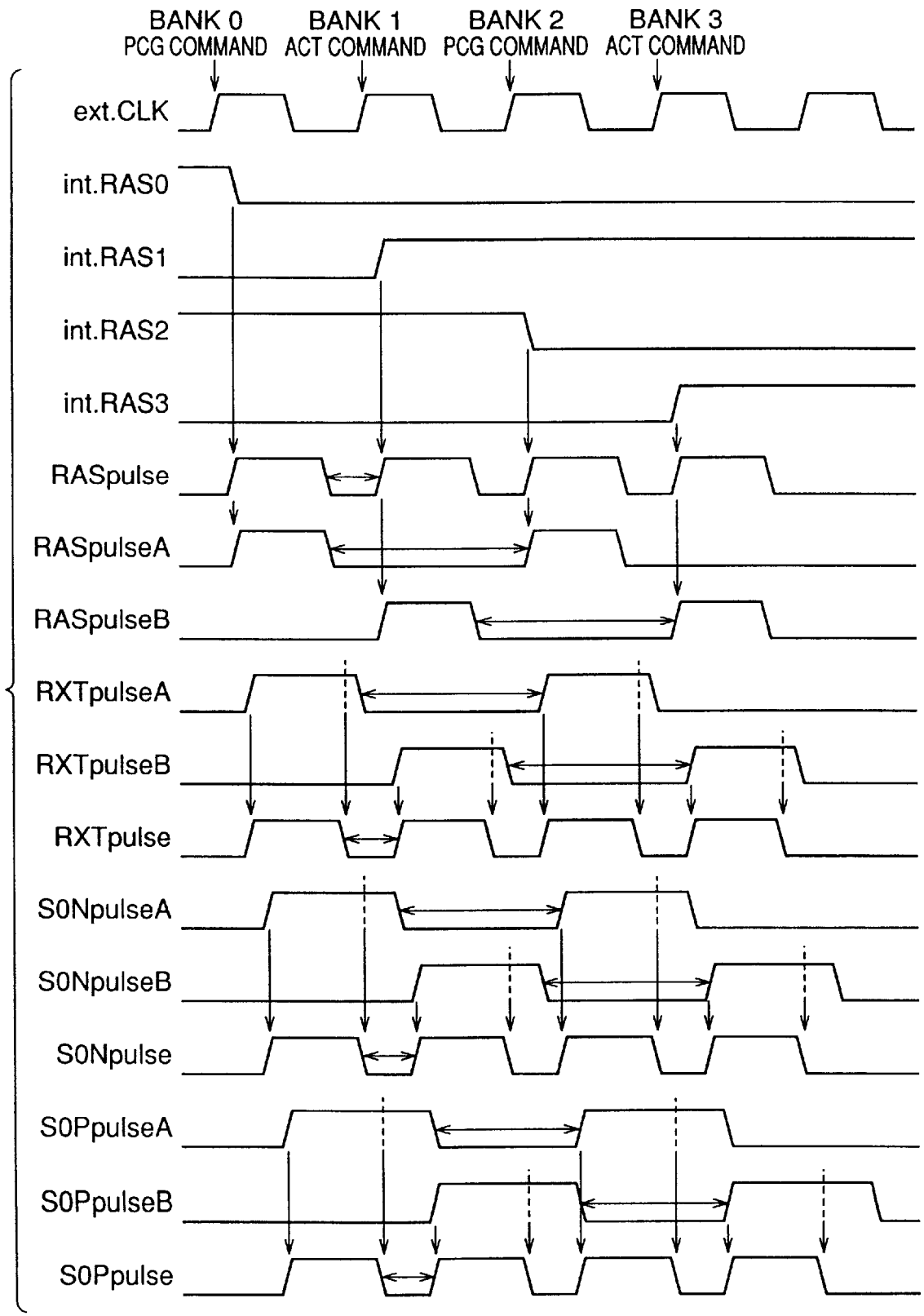
FIG. 13 is a timing chart related to operations of internal delay control signal generating circuit 300 and bank control signal generating circuit 200.
Figure 14:
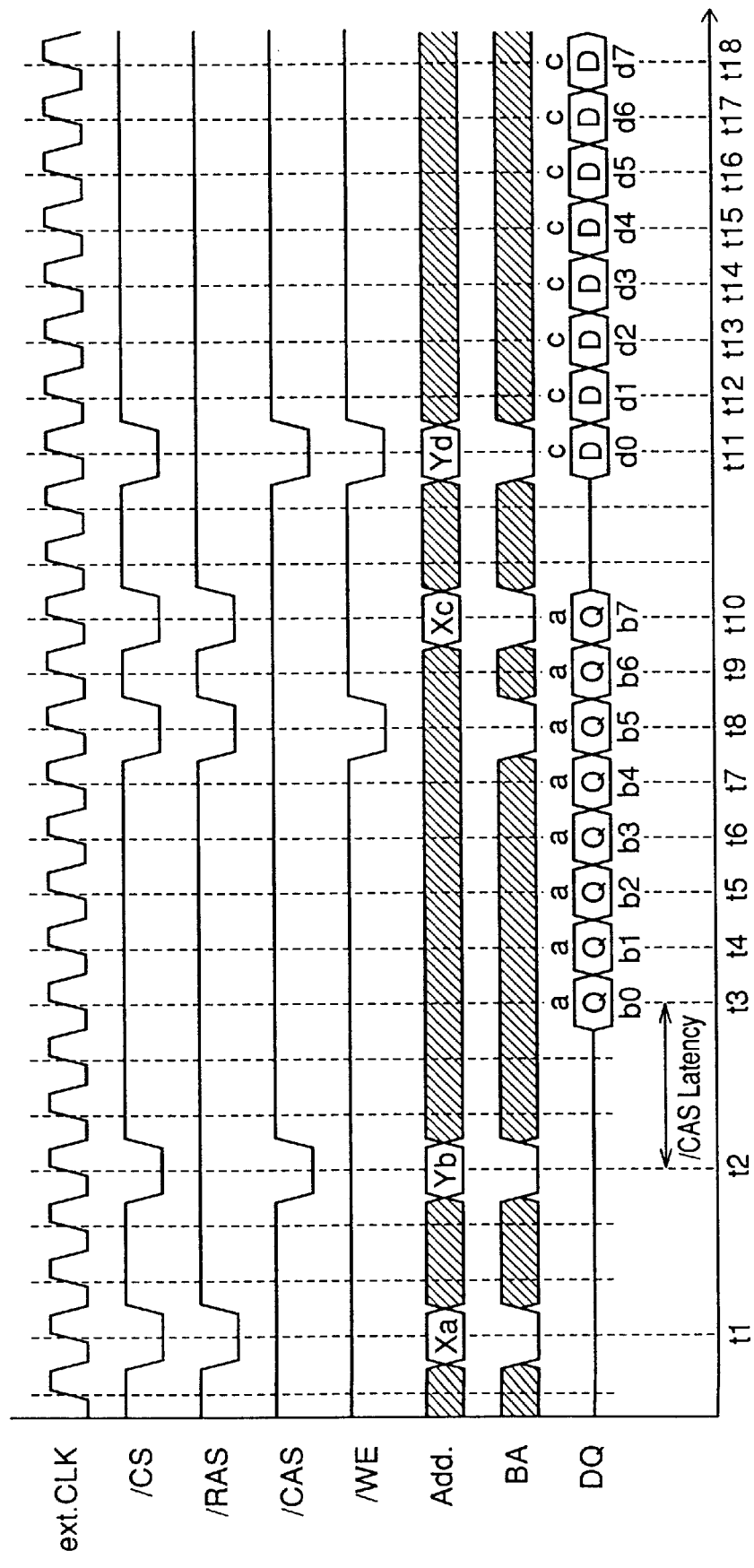
FIG. 14 is a timing chart related to the operation of the conventional SDRAM.
Figure 15:
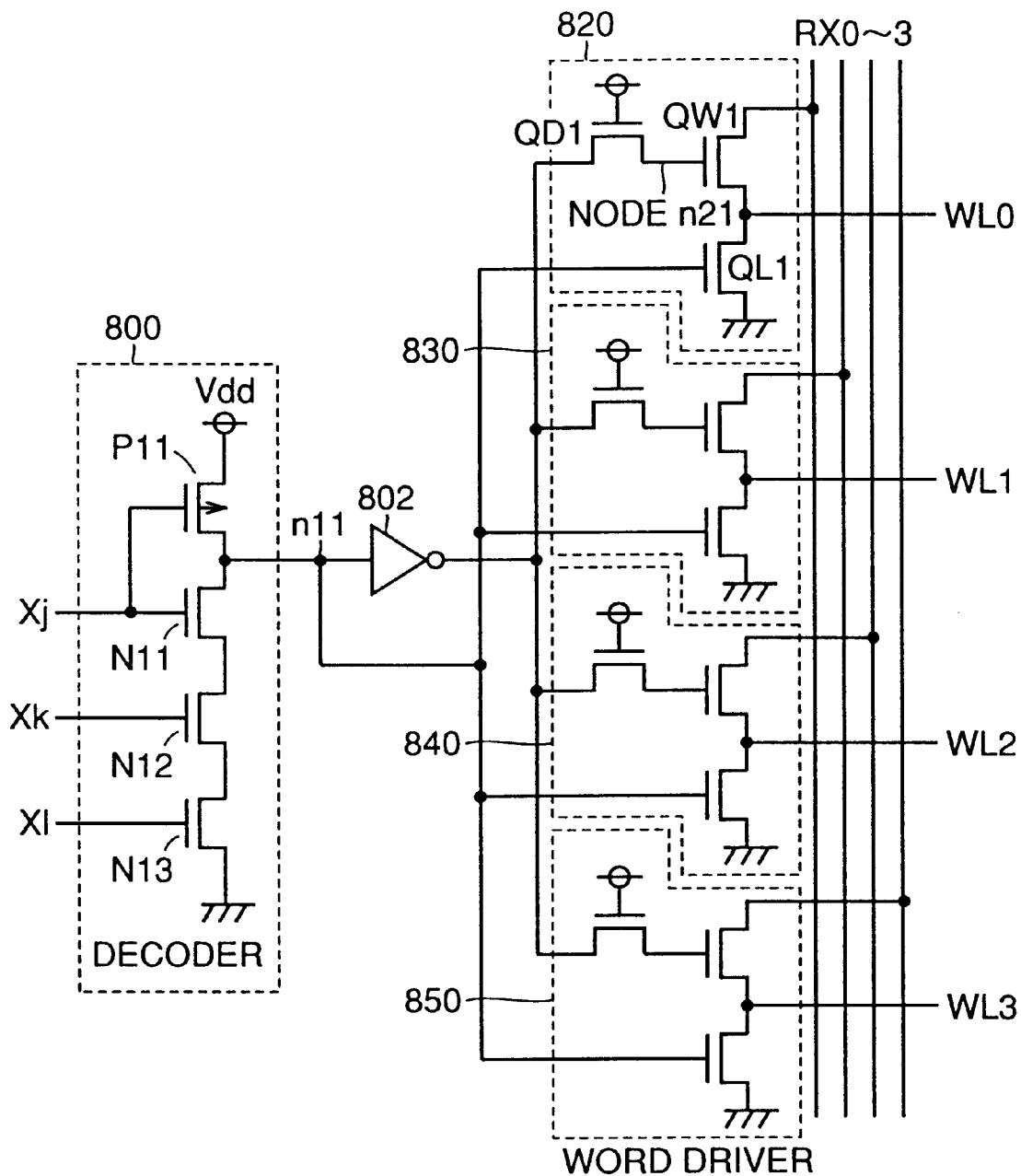
FIG. 15 is a schematic circuit diagram showing configuration of a row selecting circuit in the conventional SDRAM.
Figure 16:
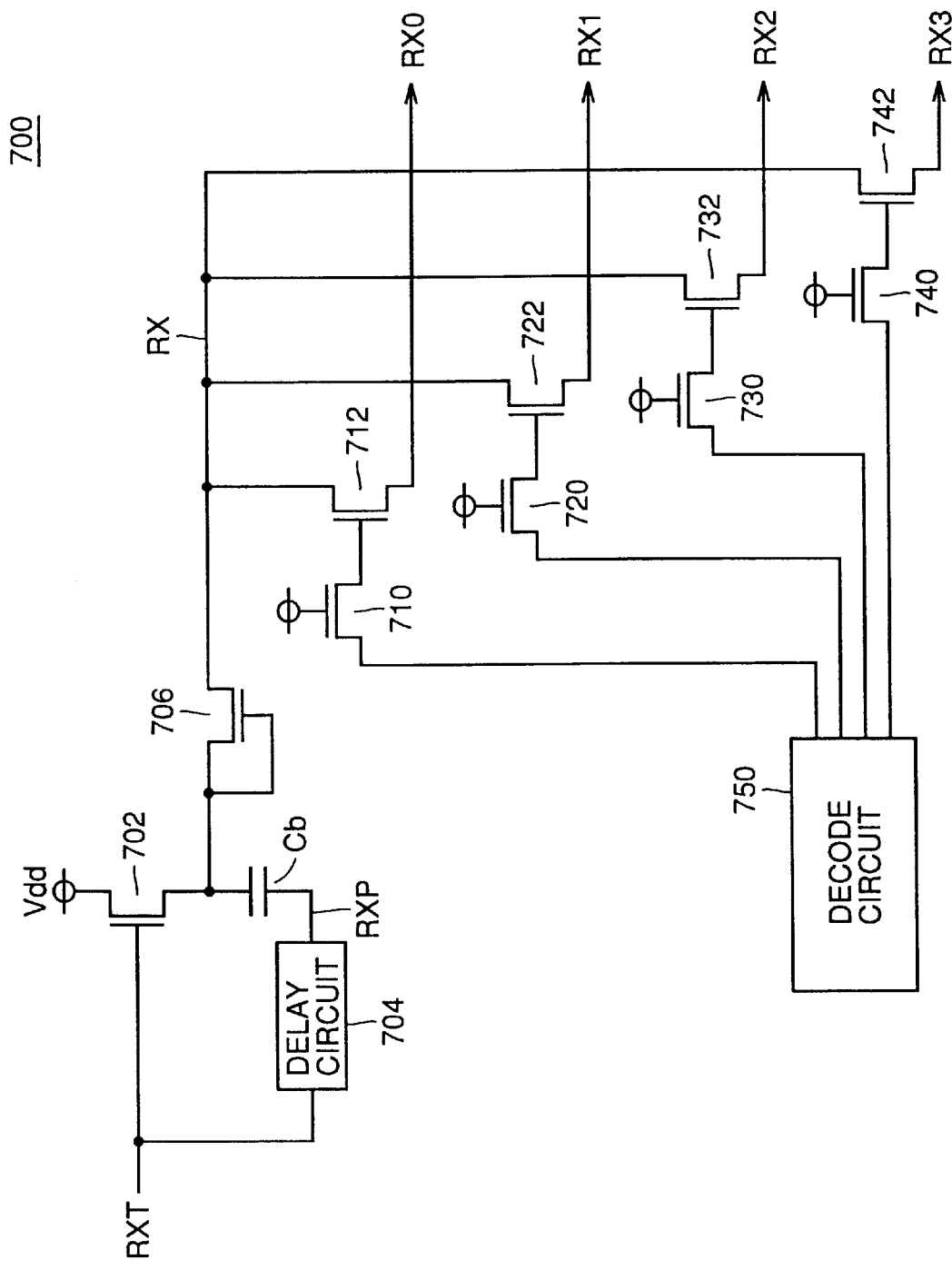
FIG. 16 is a circuit diagram showing configuration of a conventional RX decoder.
Figure 17:
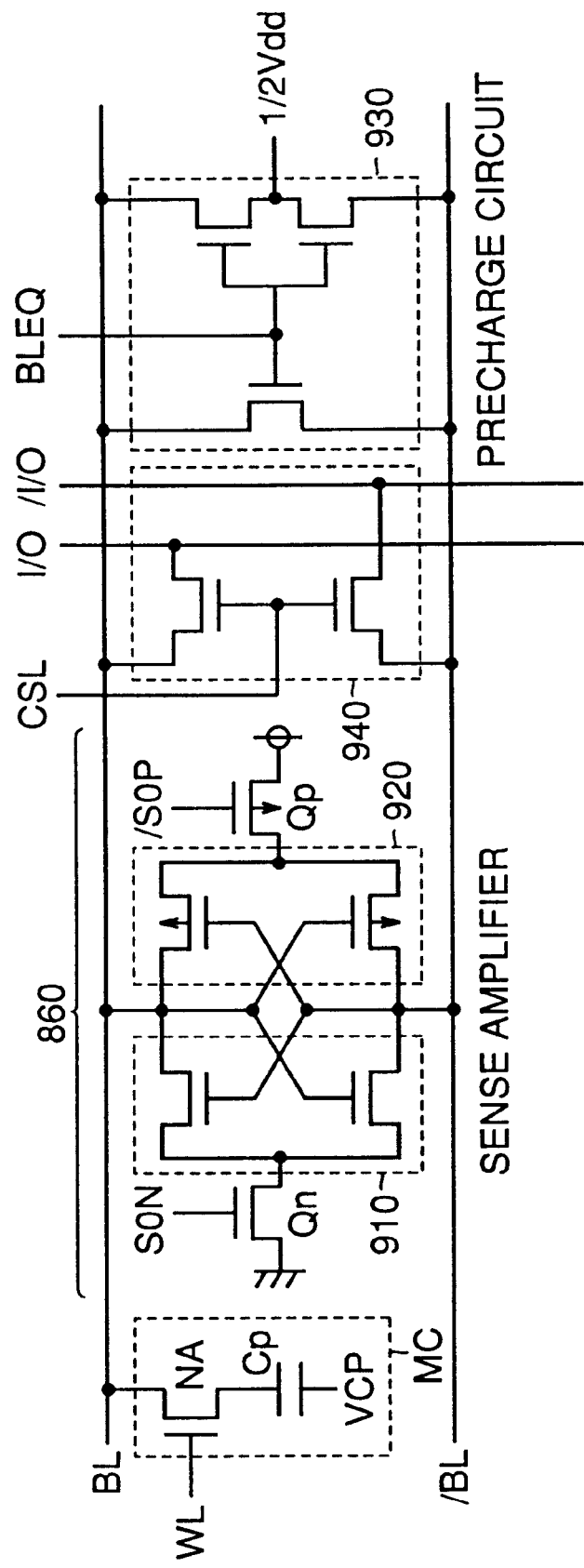
FIG. 17 is a circuit diagram showing a configuration corresponding to a column of memory cells of the conventional SDRAM.
Figure 18:
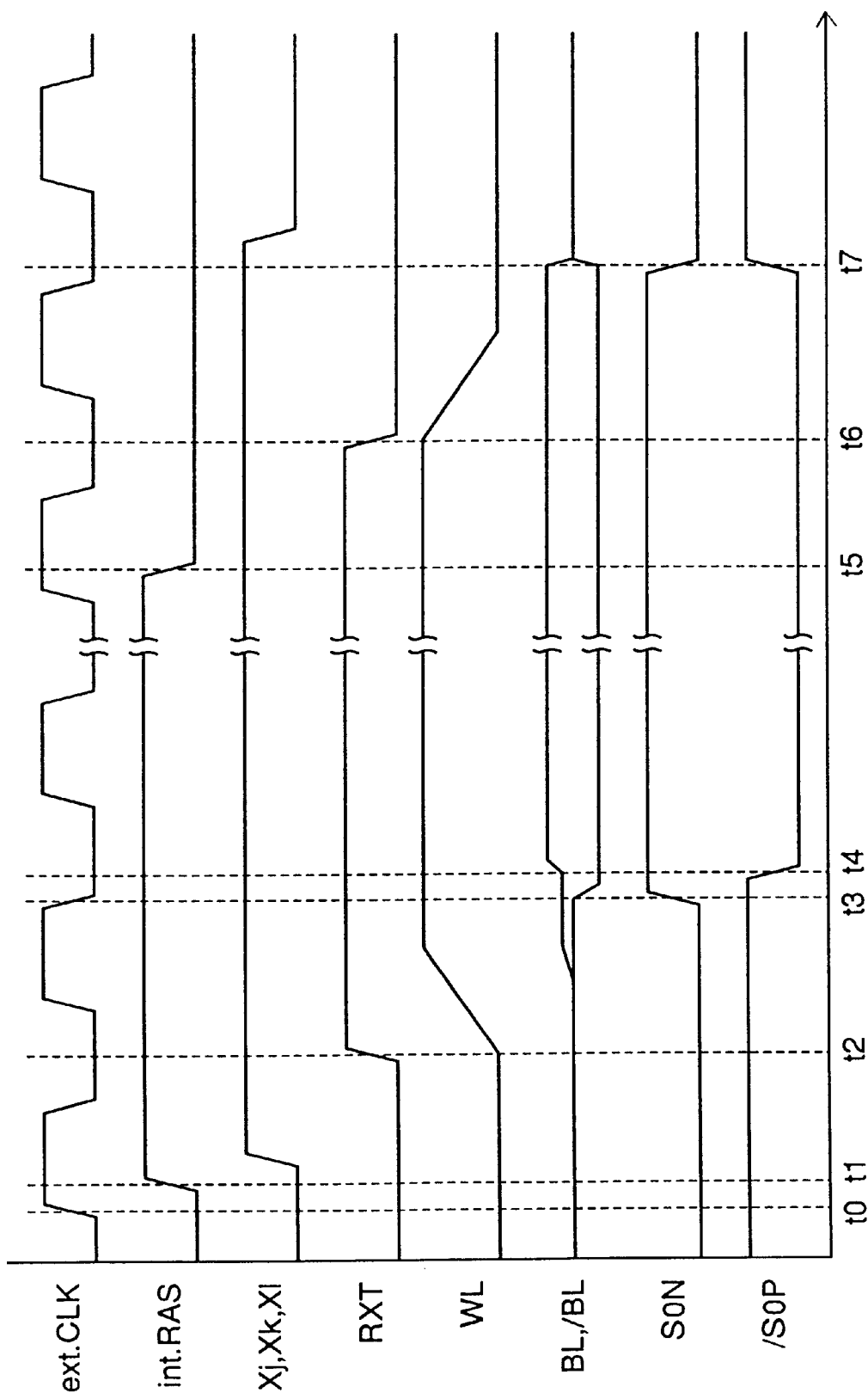
FIG. 18 is a timing chart related to the operation of the conventional SDRAM.
Figure 19:
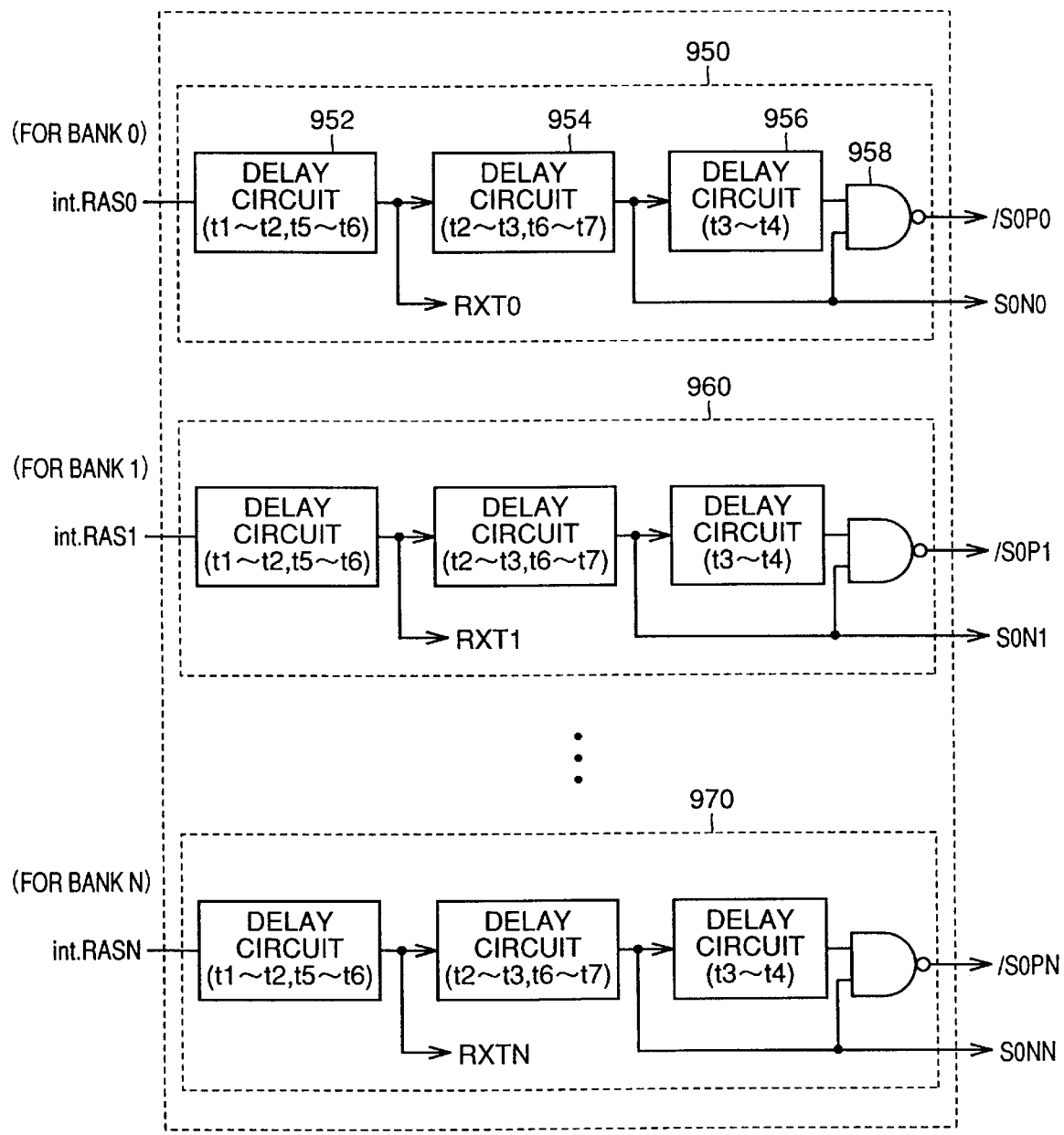
FIG. 19 is a schematic block diagram showing configuration of a control signal generating circuit controlling the conventional bank operation.

FIG. 13 is a timing chart related to the operations of delay control signal generating circuit 330 and bank control signal generating circuit 200 in accordance with the second embodiment of the present invention.

First, at time t0, when PCG command for bank0 is input, at time t1, the internal row address strobe signal int.RAS0 for bank0 attains to the "L" level. In response, the signal RASpulse is generated and input to switch circuit 302. At this time, switch circuit 302 alternately allocates the signal RASpulse to delay circuit 310 as signal RASpulseA and to delay circuit 330 as signal RASpulseB. At time t1, first, the signal RASpulseA is applied to delay circuit 310. In delay circuit 310, at time point t2 after a prescribed time period from t1, the signal RXTpulseA is generated and applied to RXTpulse generating circuit 342. RXTpulse generating circuit 342 shapes the pulse signal RASpulseA to a prescribed pulse width even if the pulse signal RASpulseA has been made less sharp with wider pulse width as it passes internal delay circuit 312 twice, provides logical sum of the signals RXTpulseA and RXTpulseB and, outputs the result as the signal RXTpulse. Therefore, when the signal RXTpulseA is input, this signal is shaped to have a prescribed pulse width, and thereafter output as the signal RXTpulse.

Thereafter, when the signal S0NpulseA is output from delay circuit 310 at time t3, S0Npulse generating circuit 344 shapes the signal width, and outputs as the signal S0Npulse.

At time t4, when the signal S0PpulseA is output from delay circuit 310, S0Ppulse generating circuit 346 receiving this signal provides the signal S0Ppulse having a pulse of a prescribed time width.

The signals output from RXTpulse generating circuit 342, S0Npulse generating circuit 344 and S0Ppulse generating circuit 346 are applied to internal control circuits of the corresponding banks.

At time t10 of the next cycle, when the ACT command for bank1 is input, at time t11, the internal row address strobe signal int.RAS1 for bank 1 is set to the active state ("H" level), and the signal RASpulse is applied to switch circuit 302.

Switch circuit 302 applies the signal RASpulse as the signal RASpulseB at this time, to delay circuit 330.

Delay circuit 330 provides a delay of a prescribed time period to the signal RASpulseB, and applies the delayed signal as the signal RXTpulseB, to RXTpulse generating circuit 342. Here, even if the signal RASpulseB comes to have less sharp pulse as it is transmitted through delay circuit 332 and the signal RXTpulseB has wide pulse width, the signal RXTpulse generating circuit 342 outputs the signal RXTpulse having a prescribed pulse width.

Similarly, the signals S0NpulseB and S0PpulseB are output by S0Npulse generating circuit 344 and S0Ppulse generating circuit 346 as signals S0Npulse and S0Ppulse having prescribed pulse widths, respectively. These signals are applied to the internal control circuits of the corresponding banks.

In this manner, as the pulse signal is allocated to two delay circuits 310 and 330, even when commands are input in continuous cycles at a high speed operation and signal widths of pulse signals passing through the delay circuits come to be wider as the signals are made less sharp, it is possible to ensure sufficient margin between the pulse signals.

Further, even when pulse signals come to have wider widths before the logical sum of the pulse signals generated by the two delay circuits 310 and 330 is to be taken, the signals RXTpulse, S0Npulse and S0Ppulse output as control signals are generated as signals having prescribed signal widths, respectively. Therefore, the signals applied to the internal control circuits corresponding to respective banks have sufficient margin.

As described above, by using bank control signal generating circuit 200 and delay control signal generating circuit 300 generating signals for controlling activation and inactivation of a plurality of banks as shown in FIGS. 9 and 10, it becomes possible to suppress increase in chip area and to ensure margin in high speed operation even in an N (N>2) bank configuration SDRAM.

More specifically, even in the plural bank configuration, two delay circuits, for example, occupying large area are provided and shared by the plurality of banks, and a circuit occupying small area such as an SR-FF circuit is provided for each bank, so as to control operation of each bank.

Though signals controlling activation and inactivation of respective banks have been described in the second embodiment, the present invention is not limited thereto. When two delay circuits, for example, are shared by the plurality of banks for other control signals which must be generated for each bank, it becomes possible to suppress increase in chip area and to ensure margin in high speed operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device operating in synchronization with an external clock signal, comprising:

a memory array having a plurality of memory cells arranged in a matrix of rows and columns, said memory array being divided into a plurality of memory blocks;

a plurality of memory selecting circuits provided corresponding to said plurality of memory blocks respectively, each for selecting a memory cell in a corresponding memory block independent from the other memory block in accordance with an address signal;

a plurality of read circuits provided corresponding to said plurality of memory blocks respectively, for reading data stored in said selected memory cell; and a control circuit for controlling an operation of said synchronous semiconductor memory device in accordance with an external control signal, including a timing control circuit provided common to said plurality of memory blocks, for delaying said external control signal for generating a timing control signal controlling operation timing of the selected memory block, and a plurality of block control circuits provided corresponding to said plurality of memory blocks respectively, each for controlling an operation of the corresponding memory block in accordance with said timing control signal.

2. The synchronous semiconductor memory device according to claim 1, wherein said timing control circuit generates a timing control signal for designating a timing of activation and inactivation of said memory block in accordance with said external control signal; and each of said block control circuits controls, when the corresponding memory block is selected, activation and inactivation operations of the corresponding memory block in accordance with said timing control signal.

3. The synchronous semiconductor memory device according to claim 2, wherein said timing control signal is a pulse signal having a prescribed time width; and each of said block control circuits includes a level holding circuit for holding active and inactive states of said corresponding memory block in response to activation of said timing signal.

4. The synchronous semiconductor memory device according to claim 1, wherein said timing control circuit generates a plurality of timing control signals at prescribed time intervals in response to said external control signal; and each of said block control circuits control, when the corresponding memory block is selected, an activating operation, a memory cell selecting operation, a data reading operation and an inactivation operation of the corresponding memory block in accordance with said timing control signals.

5. The synchronous semiconductor memory device according to claim 4, wherein each of said plurality of timing control signals is a pulse signal having a prescribed time width; and each of said block control circuits includes a plurality of level holding circuits for holding active and inactive states of said corresponding memory cell block, a state of activation of memory cell selecting operation, and a state of activation of data reading operation, respectively, in response to activation of said timing control signals.

6. A synchronous semiconductor memory device operating in synchronization with an external clock signal, comprising:

a memory cell array having a plurality of memory cells arranged in a matrix of rows and columns, said memory cell array being divided into a plurality of memory cell blocks;

a plurality of memory cell selecting circuits provided corresponding to said plurality of memory cell blocks respectively, each for selecting a memory cell of a corresponding memory cell block independent from the other memory cell blocks in accordance with an address signal;

a plurality of read circuits provided corresponding to said plurality of memory cell blocks respectively, for reading data stored in said selected memory cell; and a control circuit controlling an operation of said synchronous semiconductor memory device in accordance with an external control signal, including a timing control circuit provided common to said plurality of memory cell blocks, responsive to said external control signal for generating a timing control signal for controlling operation timing of the selected memory cell block, said timing control circuit having a plurality of timing signal generation circuits smaller in number than said plurality of memory cell blocks, for generating said timing control signal by delaying applied said external signal by a prescribed time period, and a switch circuit for allocating said external control signal successively to respective ones of said plurality of timing signal generation circuits, said control circuit further including a plurality of block control circuits provided corresponding to said plurality of memory cell blocks respectively, each for controlling an operation of the corresponding memory cell block in response to said timing control signal.

7. The synchronous semiconductor memory device according to claim 6, wherein said timing control circuit generates a timing control signal for designating a timing of activation and inactivation of said memory cell blocks in response to said external control signal; and each of said block control circuits controls, when the corresponding memory cell block is selected, activation and inactivation operations of the corresponding memory block in response to said timing control signal.

8. The synchronous semiconductor memory device according to claim 7, wherein said timing control signal is a pulse signal having a prescribed time width; and each of said block control circuits includes a level holding circuit for holding active and inactive states of said corresponding memory cell block in response to activation of said timing signal.

9. The synchronous semiconductor memory device according to claim 6, wherein said timing control circuit generates a plurality of timing control signals at prescribed time intervals in response to said external control signal; and each of said block control circuits controls an activating operation, a memory cell selecting operation, a data reading operation and an inactivating operation of the corresponding memory block in response to said timing control signals, when the corresponding memory block is selected.

10. The synchronous semiconductor memory device according to claim 9, wherein each of said plurality of timing control signals is a pulse signal having a prescribed time width; and each of said block control circuits includes a plurality of level holding circuits for holding active and inactive states of said corresponding memory cell block, a state of activation of the memory cell selecting operation, and a state of activation of the data reading operation respectively, in response to said activation of said timing control signals.

11. A semiconductor memory device comprising:

a plurality of banks capable of being driven to active/inactive states independently of each other;

a control signal generator responsive to an external control signal, for generating a plurality of internal bank activation signals corresponding to said plurality of banks respectively;

a timing control circuit provided common to said plurality of banks, for generating a common timing control signal in response to the plurality of internal bank activation signals; and a plurality of bank control signal generators provided corresponding to said plurality of banks respectively, each for controlling an operation of a corresponding one of said plurality of banks in response to the common timing control signal.

12. The semiconductor memory device according to claim 11, further comprising a plurality of row decoder groups provided corresponding to said plurality of banks respectively, wherein the common timing control signal designates timing of a word line select operation, and each of said plurality of bank control signal generators applies a word line select signal to a corresponding one of said plurality of row decoder groups for activating a word line select operation of a corresponding one of said plurality of banks in response to the common timing control signal.

13. The semiconductor memory device according to claim 11, further comprising a plurality of sense amplifier groups provided corresponding to said plurality of banks respectively, wherein the common timing control signal designates timing of a sense amplifier activate operation, and each of said plurality of bank control signal generators applies a sense amplifier activation signal to a corresponding one of said plurality of sense amplifier groups for activating the corresponding one of said plurality of sense amplifier groups in response to the common timing control signal.

14. The semiconductor memory device according to claim 11, further comprising:

a plurality of row decoder groups provided corresponding to said plurality of banks respectively; and a plurality of sense amplifier groups provided corresponding to said plurality of banks respectively, wherein the common timing control signal includes a first common signal designating timing of a word line select operation and a second common signal designating timing of a sense amplifier activate operation, said timing control circuit includes (a) a common activation signal generator for generating a common activation signal in response to the plurality of internal bank activation signals, (b) a first delay circuit for delaying the common activation signal to provide the first common signal and (c) a second delay circuit for delaying the first common signal to provide the second common signal, each of said plurality of bank control signal generators applies a word line selection signal to a corresponding one of said plurality of row decoder groups for activating a word line select operation of a corresponding one of said plurality of banks in response to the first common signal, and each of said plurality of bank control signal generators applies a sense amplifier activation signal to a corresponding one of said plurality of sense amplifier groups for activating the corresponding one of said plurality of sense amplifier groups in response to the second common signal.

15. The semiconductor memory device according to claim 11, wherein said timing control circuit generates pulses associated with the plurality of internal bank activation signals as the common timing control signal.

16. The semiconductor memory device according to claim 15, wherein each of said plurality of bank control signal generators holds a bank control signal associated with a corresponding internal bank activation signal in response to the pulse.

* * * * *

UNITED STATES PATENT AND TRADEMARK OFFICE
CERTIFICATE OF CORRECTION

PATENT NO. : 6,052,331
DATED : April 18, 2000
INVENTOR(S) : Takashi Araki, et. al.

It is certified that error appears in the above-indentified patent and that said Letters Patent is hereby corrected as shown below:

In Column 22:

Claim 7, Line 10, after "memory" insert --cell--.

Claim 8, Line 18, after "timing" insert --control--.

Claim 9, Line 27, after "memory" insert --cell--.

Claim 9, Line 28, after "memory" insert --cell--.

Signed and Sealed this

Twentieth Day of March, 2001

Attest:

NICHOLAS P. GODICI

Attesting Officer

Acting Director of the United States Patent and Trademark Office